(12) United States Patent
Horiuchi et al.

(10) Patent No.: US 8,421,999 B2
(45) Date of Patent: Apr. 16, 2013

(54) PROJECTION EXPOSURE APPARATUS AND PROJECTION EXPOSURE METHOD

(75) Inventors: Toshiyuki Horiuchi, Tokyo (JP); Hiroshi Kobayashi, Tokyo (JP)

(73) Assignee: Tokyo Denki University, Tokyo (JP)

( * ) Notice: Subject to any disclaimer, the term of this patent is extended or adjusted under 35 U.S.C. 154(b) by 707 days.

(21) Appl. No.: 12/523,917

(22) PCT Filed: Jan. 17, 2008

(86) PCT No.: PCT/JP2008/050518
§ 371 (c)(1),
(2), (4) Date: Mar. 10, 2010

(87) PCT Pub. No.: WO2008/090801
PCT Pub. Date: Jul. 31, 2008

(65) Prior Publication Data
US 2010/0195078 A1   Aug. 5, 2010

(30) Foreign Application Priority Data
Jan. 22, 2007   (JP) ................................. 2007-037073

(51) Int. Cl.
*G03B 27/32*   (2006.01)
*G03B 27/44*   (2006.01)

(52) U.S. Cl.
USPC .............................................. 355/77; 355/46

(58) Field of Classification Search .................. None
See application file for complete search history.

(56) References Cited

U.S. PATENT DOCUMENTS 5,517,279 A * 5/1996 Hugle et al. .................... 355/46
6,084,656 A * 7/2000 Choi et al. ...................... 355/71
6,184,971 B1 * 2/2001 Narita et al. .................... 355/67

FOREIGN PATENT DOCUMENTS

| JP | 61-077830 | 4/1986 |
|---|---|---|
| JP | 1-221769 | 5/1989 |
| JP | 9-244254 | 9/1997 |
| JP | 9-244255 | 9/1997 |
| JP | 2005-62847 | 3/2005 |
| JP | 2007-4075 | 1/2007 |

OTHER PUBLICATIONS

Hiroshi, K. et al., "A Novel Projection Exposure System Using Gradient-Index Lens Array," *Japanese Journal of Applied Physics*, 2008, vol. 47, No. 7, pp. 5702-5707 (Abstract, 2 pp. and article (2 pp.) from authors provided; full publication not available).
International Preliminary Report on Patentability for PCT/JP2008/050518 mailed Aug. 6, 2009 (with English translation).
International Search Report for PCT/JP2008/050518 mailed Apr. 1, 2008 (with English translation).

* cited by examiner

*Primary Examiner* — Toan Ton
*Assistant Examiner* — Michelle Iacoletti
(74) *Attorney, Agent, or Firm* — Foley & Lardner LLP

(57) ABSTRACT

Exposure areas are wholly overlapped by moving a gradient refractive index lens array in a direction perpendicular to a scanning direction, or by providing a plurality of gradient refractive index lens arrays, an optical filter having a density distribution of lightness and darkness to compensate light transmission nonuniformity of the gradient refractive index lens array is arranged, or an opening control plate for limitedly using only of a uniform portion is provided. Two or more means may be simultaneously provided among the aforementioned mean. Moreover, any one of a microscopic transmission shutter array, a microscopic reflection shutter array, and a microscopic light emitter array is used instead of a mask, or an illuminating device and the mask.

20 Claims, 9 Drawing Sheets

FIG. 3
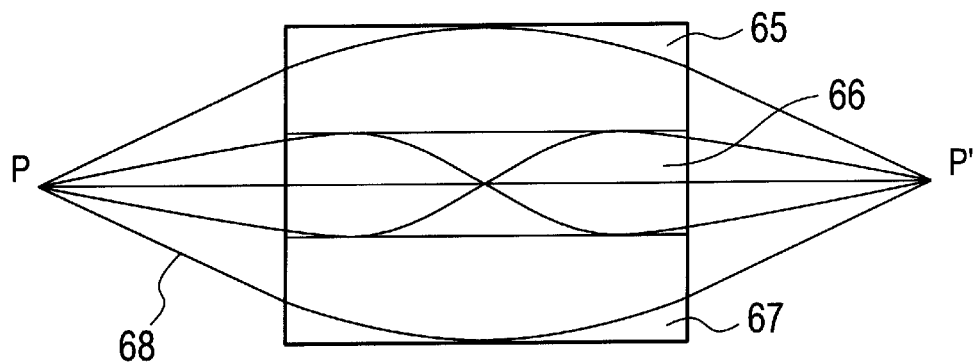
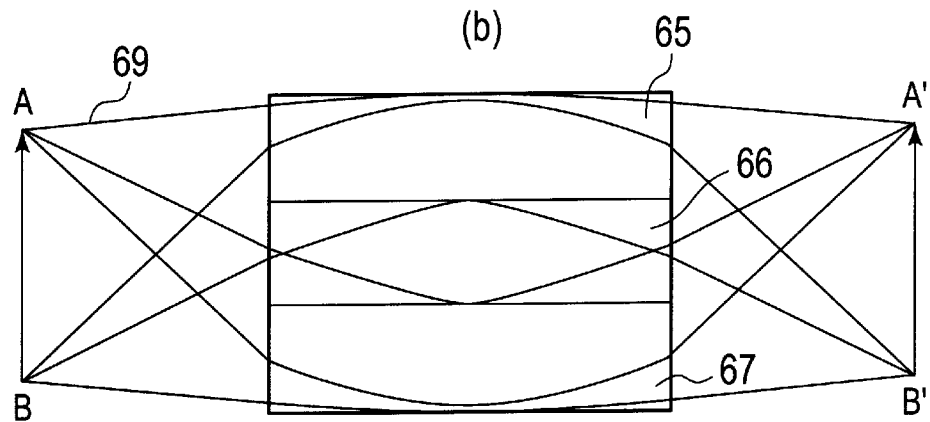
FIG. 4
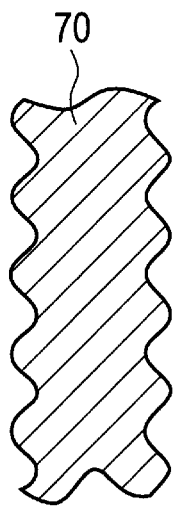

FIG. 5
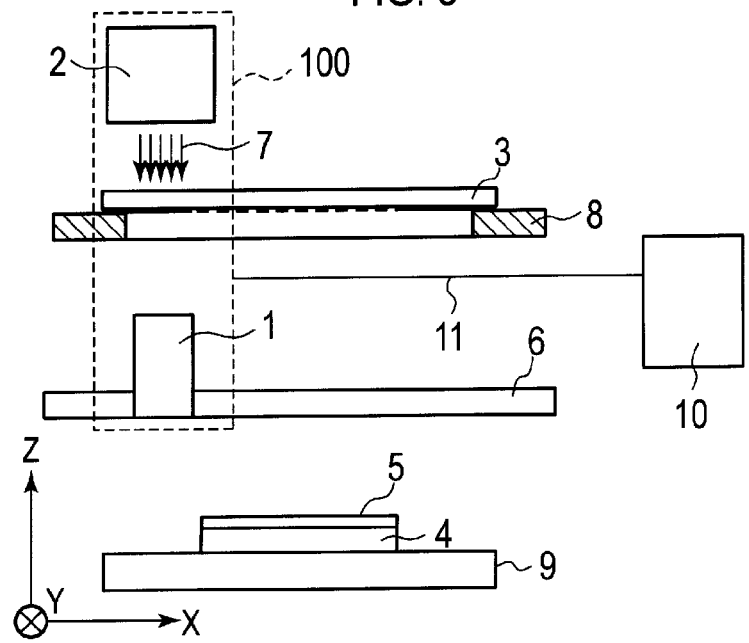
FIG. 6
(a)
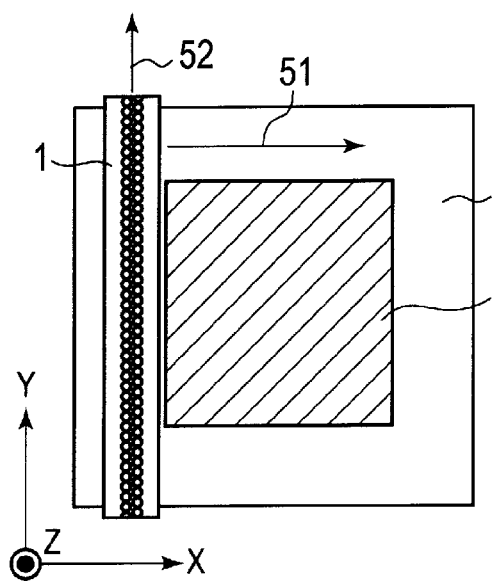
(b)
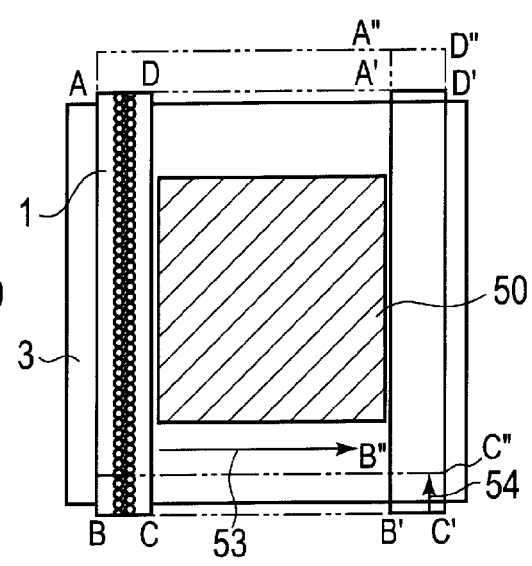

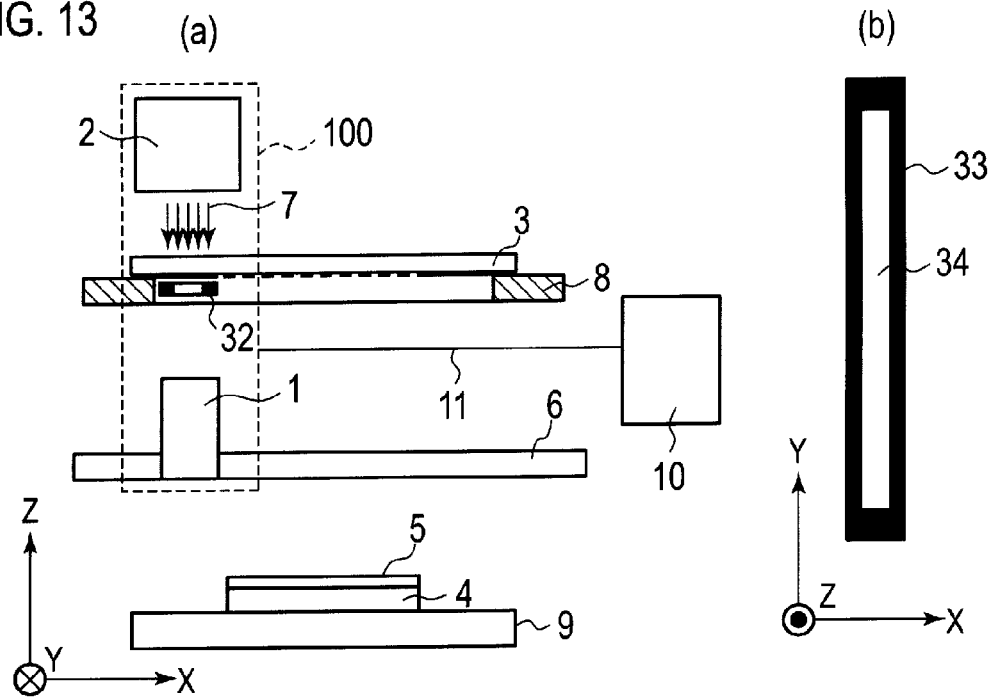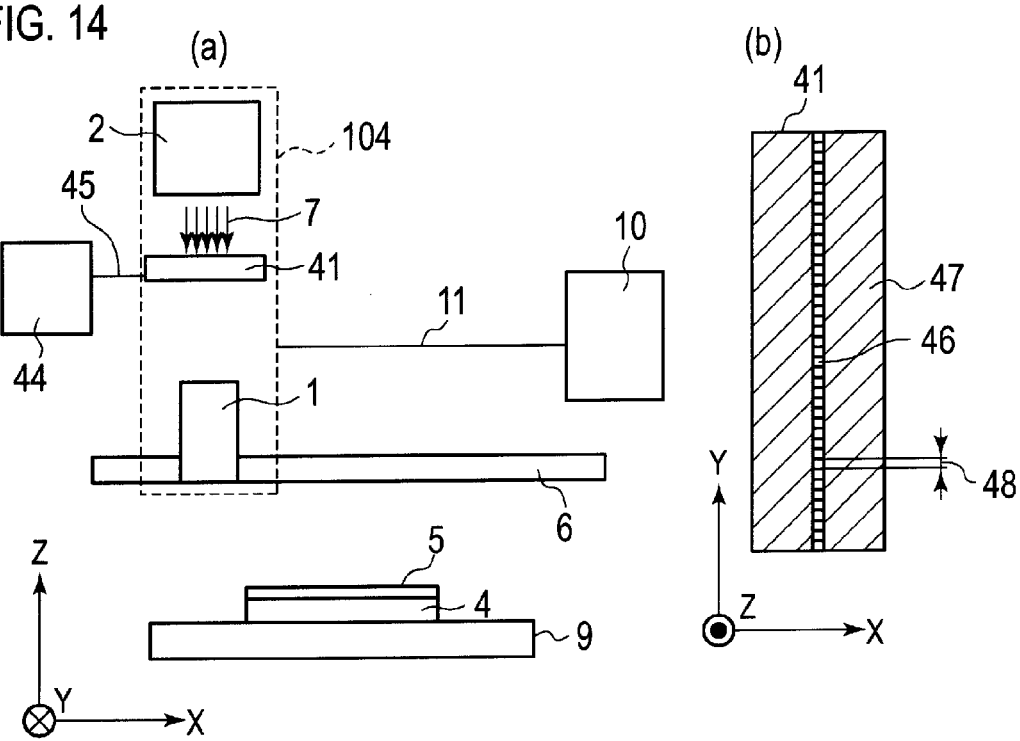

PROJECTION EXPOSURE APPARATUS AND PROJECTION EXPOSURE METHOD

CROSS-REFERENCE TO RELATED APPLICATIONS

The present application is a U.S. national stage application claiming the benefit of International Application No. PCT/JP2008/050518, filed on Jan. 17, 2008, which claims the benefit of Japanese Application No. 2007-037073, filed on Jan. 22, 2007, the entire contents of which are incorporated herein by reference in their entireties.

TECHNICAL FIELD

The present invention relates to a projection exposure apparatus and a projection exposure method for replicating a fine pattern of a display, a semiconductor integrated circuit, an optoelectronics device, a micromachine part, or the like on a large area exposed substrate such as a large sized glass substrate, a plastic substrate, a plastic substrate with copper foil, and a screen for screen-printing, a metal sheet, or a large-diameter wafer.

BACKGROUND ART

Exposure is used for replicating a pattern of a mask onto a photosensitive material, such as a photoresist formed on an exposed substrate, in which a mask on which the pattern is formed by depositing a shielding material, such as chromium, on a transparent substrate such as glass and then etching it, and short wavelength visible light, ultraviolet rays, deep ultraviolet rays, or the like are then irradiated on the exposed substrate through the mask. A process of selectively leaving only an exposed portion or a non-exposed portion of the photosensitive material, such as development or the like is added after the exposure, so that a pattern of the photosensitive material corresponding to the mask pattern is formed.

The exposure method includes a close contact exposure method, a proximity exposure method, and a projection exposure method.

In the close contact exposure method, the exposure is performed while the mask and the exposed substrate are held in close contact with each other. The reason why the mask and the exposed substrate are closely contacted with each other is to increase resolution. The narrower the space between the mask and the exposed substrate is, the further the influence of diffraction of light emitted from a transparent part of the mask can be reduced, thus increasing the resolution.

However, although it is possible to closely contact the mask with the exposed substrate approximately uniformly in small liquid crystal panels or small-diameter wafers, since it is difficult to make and keep surfaces of the mask and the exposed substrate perfectly plane, and it is also difficult to control so that a contact pressure therebetween may become uniform during the close contact in large-sized exposed substrates, such as a flat display panel or the like, the whole mask cannot be closely contacted uniformly. As a result, force focuses on one portion, and some photosensitive materials where the contact pressure is high easily transfer to the mask. Fragments of the transferred photosensitive material serves as a half-shielding portion or a shielding portion of for mask pattern during the next exposure, thus causing a transcription defect. Additionally, mask defects resulting from the transferred photosensitive materials increase at an accelerated pace by repeating close contact.

Meanwhile, since the uneven contact between the mask and the exposed substrate may cause a relative movement between the mask and the exposed substrate in a plane direction, scratches may be caused in the mask or the exposed substrate if hard contaminants are caught in the contact portion accidentally.

Meanwhile, in the proximity exposure, the exposure is performed by proximately holding the mask and the exposed substrate while providing a small gap (for example, 10 micrometers to 50 micrometers) between the mask and the exposed substrate. Occurrence of a contamination of the mask or a transcription defect due to the photosensitive material on the exposed substrate adhering to the mask side, and occurrence of a scratch on the mask or the exposed substrate due to the exposed substrate and the mask contacting with each other can be considerably reduced further than those of the close contact exposure by employing the proximity exposure.

However, also in the proximity exposure method, when making the large mask and the large exposed substrate proximate to each other, it is difficult to keep the gap between the mask and the exposed substrate uniformly constant. As a result, problems of the close contact exposure such that the mask and the exposed substrate are partially contacted so that some photosensitive materials are transferred to the mask to thereby cause the transcription defect, or the scratch occurs in the mask or the exposed substrate cannot be thoroughly solved. Moreover, the larger an exposure field becomes, the further a risk for the mask and the exposed substrate to partially contact increases.

In addition, when the exposure field is large, a variation in the small gap between the mask and the exposed substrate is also increased, and line width and shape of the pattern replicated by the exposure are dependent on the gap between the mask and the exposed substrate, so that there has been a problem that the variation in the line width and shape of the pattern is increased within the exposure field.

The projection exposure method is a method in which a projection optical system, such as a projection lens optical system in which lenses are arranged in series in combination with each other within a lens-barrel, a projection mirror optical system by a combination of mirrors, a projection optical system by a combination of both lenses and mirrors, or the like is inserted between the mask and the exposed substrate, and an light image of the pattern is formed on the exposed substrate to thereby expose the photosensitive material.

When this method is utilized, the pattern formed on the mask is replicated on the exposed substrate via the projection optical system, and thus the mask and the exposed substrate do not contact with each other, so that problems such that some photosensitive materials are transferred to the mask to thereby cause the transcription defect, or the scratch occurs in the mask or the exposed substrate are not caused.

Additionally, since a working distance and a certain amount of depth of focus can be secured by employing the projection optical system, setting for the exposure can be simplified, so that there is a merit that the variation in the line width and shape of the pattern within the exposure field can be reduced.

However, in this projection exposure method, when a large-sized exposed substrate such as a large-sized glass substrate for flat displays or the like, a plastic substrate, a plastic substrate with copper foil, a screen for screen-printing, a metal sheet, and a large-diameter wafer are exposed, a projection optical system with a large exposure field equal to or larger than the exposed substrate in size is needed if a one-shot exposure is tried. Moreover, it is difficult to manufacture the aforementioned projection lens and projection mirror optical systems with a large diameter, and on top of it, they are significantly expensive since a particular design is required also for maintenance thereof or control of an operating environment, thereby increasing cost of exposure equipment and exposure operation significantly.

Meanwhile, as one measure to cope with the large exposure field, the large field can be exposed by performing a scanning exposure using a small projection optical system and by connecting the exposure fields together. However, a projection optical system which is generally used is a projection optical system to form an inverted real image of the pattern on the mask as represented by the projection lens.

For that reason, when a plurality of projection optical systems described above are arranged next to each other to thereby expose a pattern AB on the mask as illustrated in FIG. 1, a light image A1' B1' is projected by a projection lens 61, a light image A2' B2' is projected by a projection lens 62, and a light image A3' B3' is projected by a projection lens 63, so that the light images are not overlapped at the same position on the exposed substrate, thus not allowing the pattern to be replicated well. Here, a line group 64 indicates light beams.

Hence, in the case of the projection optical system which forms an inverted real image, it has been required that even when the scanning exposure is performed, it is performed by one projection optical system, or a plurality of projection optical systems are arranged sufficiently spaced apart from one another to prevent light from the same pattern from entering into the plurality of projection optical systems simultaneously.

Meanwhile, even when the scanning exposure is performed or the exposure fields are connected together, it is required to precisely synchronize the mask with the exposed substrate to move them in reverse directions, so that there have been problems that a scanning mechanism and its control are complicated and adjustment man-hours of the mechanism increase, maintenance and management of the accuracy take time and effort, or the like.

In order to solve these problems, and to arrange a plurality of lens elements with a small diameter next to one another to thereby form the image of the pattern over the lens elements accurately, it is required that the pattern to be projected is formed as an erected image of the same magnification and the images formed by respective lens elements are overlapped at the same position.

Means for constructing a small, simple and cheap projection optical system to form the erected image of the same magnification includes a projection exposure method of the same magnification in which a gradient refractive index lens array is inserted between the mask and the exposed substrate (for example, Japanese Unexamined Patent Application Publication (Kokai) No. Sho 61-77830).

The gradient refractive index lens array is an optical component in which cylindrical lens elements 71 having a distribution of refractive indexes in a radial direction from a column axis to a circumference surface are arranged in an array shape in a single line or plural lines while circumference surfaces of the cylindrical lens elements contact with each other and they are disposed between base plates 72 for fixing as shown in FIG. 2.

When this gradient refractive index lens array is utilized, an erected real image of the same magnification will be formed if an object surface and an image surface are taken in suitable positions, and a point pattern P and an arrow pattern AB on the mask are overlappingly replicated at the same positions P' and A'B' on the exposed substrate by a plurality of adjacent lens elements 65, 66, and 67 of the gradient refractive index lens array as shown in FIG. 3. Here, line groups 68 and 69 indicate light beams.

Hence, if the gradient refractive index lens array is placed between the mask and the exposed substrate to form an erect real image of the same magnification of the mask pattern near the gradient refractive index lens array on the exposed substrate, and the gradient refractive index lens array is used for scanning in a direction perpendicular to an arrangement of the lens elements, a large area can be exposed by the small optical component to thereby replicate the pattern.

DISCLOSURE OF THE INVENTION

However, even in the projection exposure of the same magnification using the aforementioned gradient refractive index lens array of the conventional art, the image of the mask pattern cannot be uniformly formed only by simply using the gradient refractive index lens array. The reason is that, in the gradient refractive index lens array, even when a light intensity distribution of an incident light is in a uniform state, an irradiation area and a light intensity distribution on an emitting side depend on a geometric array of the lens elements since emitted lights from respective lens elements constituting the gradient refractive index lens array are overlapped, resulting in an irradiation range 70 where periodicity is observed in the outline on the exposed substrate as illustrated in FIG. 4. Additionally, since the uniformity deteriorates due to manufacturing error of the lens element, pitch error of the array, flatness error of the end surface, or the like, the light intensity distribution in the irradiation area will also be in a nonuniform state.

The non-uniformity may appear in the light intensity distribution as described above, and thus when a fine pattern with the minimum line width of about 2 to 100 micrometers is projected as in the case of the semiconductor manufacturing or the liquid crystal panel manufacturing, predetermined patterns with sufficient accuracy cannot be formed in all the areas within a field where the scanning exposure is performed due to the influence of this non-uniformity, only by simply using the gradient refractive index lens array for scanning in the direction perpendicular to the arrangement of the lens elements to allow the mask pattern to be projected.

The present invention intends to solve the problems that such a conventional constitution has had, and it aims at achieving a projection exposure apparatus and a projection exposure method capable of reducing the non-uniformity of the light intensity distribution within the irradiation area, and forming a pattern finer than previous one, in which a line width change of the transcriptional pattern is small to the same mask pattern line width and the sidewall is smooth.

A first aspect of the present invention is characterized by a projection exposure apparatus provided with an illuminating device for illuminating a mask on which a pattern is formed, a first gradient refractive index lens array for projection-exposing and replicating the pattern formed on the mask to an exposed substrate by a mask illumination light from the illuminating device, a first movement mechanism for making the first gradient refractive index lens array scan or move intermittently relatively to the exposed substrate, and further provided with at least one of (1) a second movement mechanism for moving the first gradient refractive index lens array in a direction perpendicular to a direction of scanning or intermittent-moving relatively to the exposed substrate during exposure or exposure processes, (2) second and third gradient refractive index lens arrays displacedly arranged with respect to a direction of the arrangement of the lens elements which constitute the first gradient refractive index lens array, and (3) an opening control plate for controlling a projection range in a direction perpendicular to the direction of the arrangement of the lens elements which constitute the first gradient refractive index lens array just behind the mask or near a plane conjugate to a pattern surface of the mask.

A second aspect of the present invention is characterized by a projection exposure method, including a first movement process for making a gradient refractive index lens array which is arranged between a mask on which a pattern is formed and an exposed substrate and projects the pattern on the mask onto the exposed substrate scan or intermittently move relatively to the exposed substrate at least one time, while illuminating the mask by an illuminating device, and a second movement process for moving the gradient refractive index lens array in a direction perpendicular to a direction of relative scan or intermittent movement.

BRIEF DESCRIPTION OF THE DRAWINGS

FIG. 3(a) and FIG. 3(b) are explanatory views of image formation when a plurality of gradient refractive index lenses are arranged next to each other;

FIG. 4 is an explanatory view of non-uniformity of an irradiated area of the gradient refractive index lens array;

FIG. 5 is an explanatory view of a projection exposure apparatus of a first embodiment of the present invention;

FIG. 6(a) and FIG. 6(b) are explanatory views of a projection exposure method of the first embodiment of the present invention;

FIG. 13(a) and FIG. 13(b) are explanatory views of a projection exposure apparatus and a projection exposure method of a fourth embodiment of the present invention;

FIG. 14(a) and FIG. 14(b) are explanatory views of the projection exposure apparatus of the first embodiment in which a transmission type microscopic shutter array is used;

BEST MODE(S) FOR CARRYING OUT THE INVENTION

Figure 1:
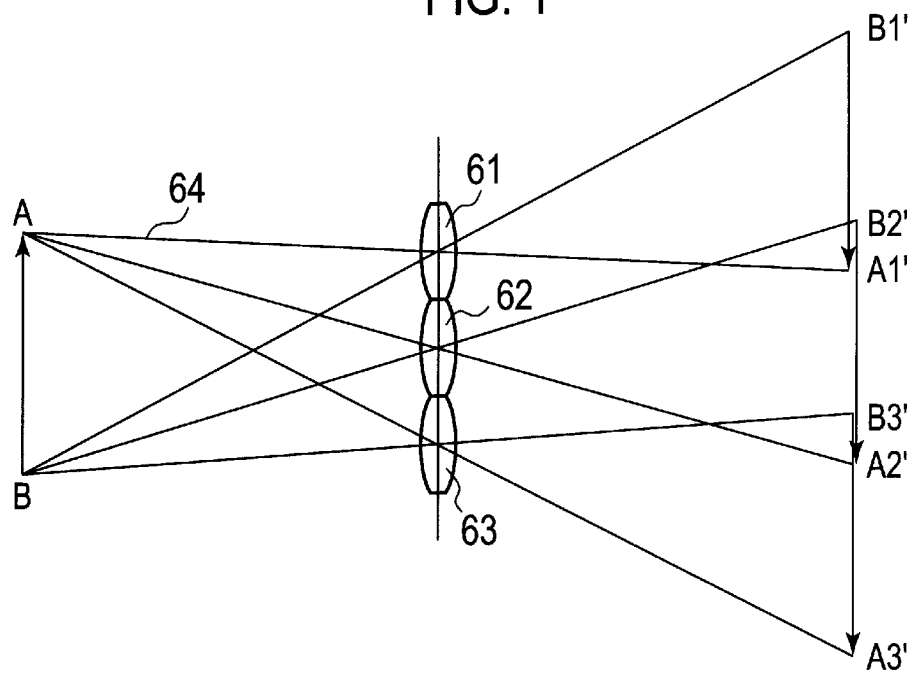
FIG. 1 is a view of explaining problems when a plurality of projection optical systems which form inverted real images are arranged next to each other.
Figure 2:
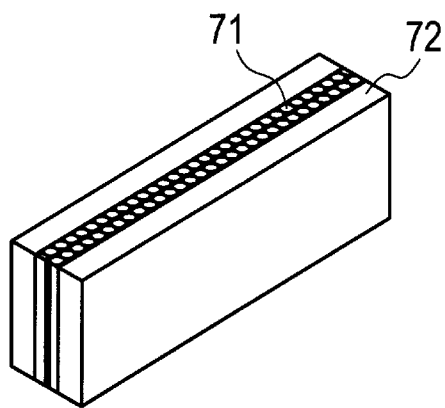
FIG. 2 is an explanatory view of a gradient refractive index lens array.
Figure 7:
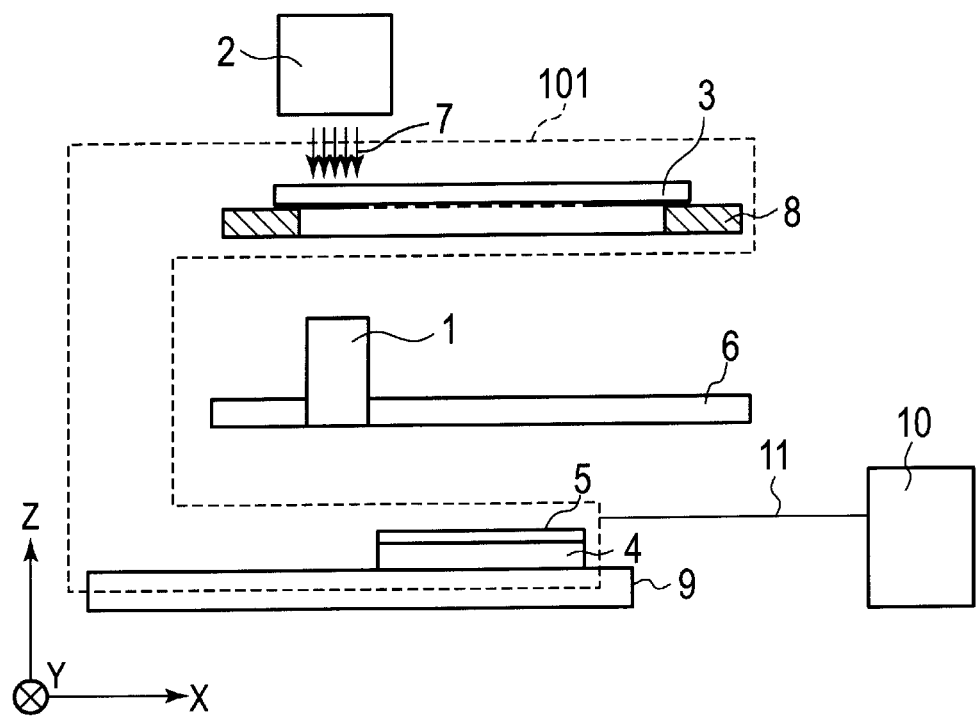
FIG. 7 is an explanatory view of another projection exposure apparatus of the first embodiment of the present invention.

FIG. 5 through FIG. 7 are explanatory views of a projection exposure apparatus and a projection exposure method of a first embodiment of the present invention.

First, the projection exposure apparatus of the first embodiment of the present invention will be described with reference to FIG. 5. In FIG. 5, among XYZ coordinate systems which are Cartesian coordinates, a vertical direction is defined as a Z-axis direction, a direction which is a horizontal direction and perpendicular to a lens arrangement direction of a gradient refractive index lens array is defined as an X-axis direction, and the lens element arrangement direction of the gradient refractive index lens array 1 is defined as a Y-axis direction.

A mask 3 is illuminated by an illuminating device 2 composed of a light source and an illumination optical system to project a pattern shape on the mask 3 onto an exposed substrate 4 through the gradient refractive index lens array 1 which is a projection optical system by an illumination light, and a photosensitive material 5 coated on the exposed substrate 4 is exposed.

The gradient refractive index lens array 1 is arranged on a stage 6. The stage 6 has a moving range in the X-axis direction larger than an entire exposure range of the exposed substrate 4 so that the pattern shape on the mask 3 can be projected to the entire exposure range of the exposed substrate 4, and continuously moves or intermittently moves in the X-axis direction in parallel to the exposed substrate 4. In addition, it can move also in the Y-axis direction by an arbitrary distance in order to improve exposure uniformity as described below, and even when the gradient refractive index lens array 1 can irradiate a width in the Y-axis direction sufficiently larger than the entire exposure range of the exposed substrate 4 in the Y-axis direction, it can move in the Y-axis direction.

Note that, in the present embodiment, the illuminating device 2 is set in a stage which is not shown, and moves in synchronization or integrally with the stage 6 so that a constant amount of light may always enter into the gradient refractive index lens array 1. Reference numeral 7 represents an illumination light, and a dotted line 100 indicates a unit 100 in which the gradient refractive index lens array 1 and the lighting system 2 move in synchronization or integrally with each other.

By using the illuminating device 2 having an illuminated field so large as to always irradiate the whole area of the mask 3, only the gradient refractive index lens array 1 may be moved while the illuminating device 2 is fixed.

A stage 8 holds the mask 3, while a stage 9 holds the exposed substrate 4.

Drive control of the stage 6 and the illuminating device 2, namely, drive control of the unit 100 is performed by a computer 10. A line denoted by reference numeral 11 indicates that the unit 100 is connected with and controlled by the computer 10 through a cable or the like. When only the gradient refractive index lens array 1 is moved while the illuminating device 2 is fixed by using the illuminating device 2 having a large illuminated field, what is necessary is to connect only the stage 6 with the computer 10.

FIG. 6 is a view for explaining the projection exposure method of the first embodiment of the present invention. While it is the figure when FIG. 5 is viewed from the top, the gradient refractive index lens array 1 is drawn over the mask 3 for the purpose of easy understanding of the figure. A large number of circles drawn in the gradient refractive index lens array 1 schematically show a cross section of lens elements of the gradient refractive index lens array 1.

The computer 10 performs movement control of the stage 6 in one axis of the X-axis direction, and during a scan or intermittent movement 51 of the gradient refractive index lens array 1 in the X-axis direction indicated by an arrow, it also controls a scan or intermittent movement 52 of the gradient refractive index lens array 1 indicated by an arrow also in the Y-axis direction in synchronization with it as shown in FIG. 6(a) to thereby form an exposure area 50 of the gradient refractive index lens array 1 displacedly and overlappingly.

Alternatively, as shown in FIG. 6(b), it controls to perform a movement 54 with a predetermined distance indicated by an arrow in the Y-axis direction so as for the exposure region 50 to be overlappingly formed in the Y-axis direction on completion of a scan or intermittent movement 53 in the X-axis direction indicated by an arrow. Namely, four corners ABCD of the gradient refractive index lens array 1 are moved to A"B"C"D" after moving them to A'B'C'D'. Incidentally, an amount of the movement is drawn largely with exaggeration for the purpose of easy understanding of the figure. Subsequently, the gradient refractive index lens array 1 and the lighting system 2 are controlled so as to perform a scan or intermittent movement in a negative direction along the X-axis. Exposure is repeatedly performed during the scan or intermittent movement 53 in the X-axis direction, or during the scan or intermittent movement in the negative direction of the X-axis after the movement 54 described above to thereby adjust a total amount of light exposure to be an appropriate light exposure amount, and thus the photosensitive material 5 on the exposed substrate 4 is exposed.

The stage 6 is once returned to a side AB after the movement 54 with a predetermined distance in the Y-axis direction, or the movement 54 with a predetermined distance in the Y-axis direction is performed after the stage 6 is once returned to the side AB, and subsequently the gradient refractive index lens array 1 and the lighting system 2 may scan or intermittently move in a positive direction of the X-axis, again. Incidentally, it is needless to say that the scan or intermittent movement in the X-axis direction is not limited to two times, but it may be performed by arbitrary times in combination with the movement with a predetermined distance in the Y-axis direction.

The computer 10 further has a stage control system for controlling so as to provide the most suitable light exposure amount to the photosensitive material 6 on the exposed substrate 4.

Here, the most suitable light exposure amount is a light exposure amount to reach a threshold value for the photosensitive material 5 on the exposed substrate 4 to be exposed, or is a light exposure amount in which the size and shape of the pattern obtained after a pattern actualization process, such as development by a light exposure amount not less than the threshold light exposure amount become desired value and form. Instructions of moving speed control of the stage 6 and control of an overlapping amount of the exposure area are given by the computer 10, and a photosensitive amount given to the photosensitive material 5 is controlled so as to be a suitable amount in consideration of a speed and the number of times of the scan or intermittent movement in the X-axis direction, a photosensitive property of the photosensitive material 5, or the like.

Note herein that, although there is employed a configuration in which the gradient refractive index lens array 1 and the illuminating device 2 move as the unit 100 to the exposed substrate 4 in the present embodiment, there may be employed a configuration in which both of components move relatively, such as a configuration in which the illuminating device 2 and the gradient refractive index lens array 1 are fixed, and the mask 3 and the exposed substrate 4 move.

FIG. 7 is another projection exposure apparatus of the first embodiment in which the gradient refractive index lens array 1 and the illuminating device 2 are fixed, and the mask 3 and the exposed substrate 4 are moved. The stages 8 and 9 which move in synchronization or integrally with each other are constituted into a unit 101, and the mask 3 and the exposed substrate 4 are scanned or intermittently moved in the X-axis direction. Moreover, by the scan or intermittent movement also in the Y-axis direction during the scan or intermittent movement in the X-axis direction or the combination of the scan or intermittent movement in the X-axis direction and the movement in the Y-axis direction as shown in FIG. 6, overlapped exposure is performed while shifting the exposure area. The computer 10 controls the unit 101. A line 11 indicates that the unit 101 is connected to the computer 10 with a cable or the like to be controlled.

Since the scan or intermittent movement, and the movement of the gradient refractive index lens array 1 to the exposed substrate 4 may be performed relatively, it may be performed by an arbitrary combination such that the scan or intermittent movement, and the movement in the X-axis direction are performed by moving the mask 3 and the exposed substrate 4 in synchronization or integrally with each other by the stages 8 and 9, the scan or intermittent movement in the Y-axis direction is performed by moving the gradient refractive index lens array 1 by the stage 6, or the like.

Incidentally, although distances of the scan or intermittent movement, and the movement in the Y-axis direction may be arbitrary, there are components of light intensity unevenness having a feature to appear periodically in a form of approximately corresponding to a geometric arrangement of lens elements as a light intensity distribution of an imaging surface of the gradient refractive index lens array 1 as shown in FIG. 14, so that if the scan or intermittent movement is performed in the X-axis direction to expose, and the scan or intermittent move is performed in the Y-axis direction during exposure, it may be more preferable to move it by integral multiples of a pitch of the light intensity unevenness. The scan or intermittent movement in the Y-axis direction is preferably moved by one pitch of the light intensity unevenness at the minimum while the gradient refractive index lens array 1 passes through a distance corresponding to a width in the X-axis direction projected by the gradient refractive index lens array 1 which is stopped, and thus it is moved repeatedly during exposure while scanning or intermittently moving the entire exposure area in the X-axis direction. Since an overlappingly exposed portion becomes narrower when the scan or intermittent movement is repeated many times in the same direction of the Y-axis, it is effective to perform reciprocation by performing the scan or intermittent movement in a positive direction and a negative direction of the Y-axis alternately.

Meanwhile, if the exposure by scanning or intermittently moving in the X-axis direction and the movement in the Y-axis direction are sequentially performed, it is effective to move it in the Y-axis direction by every distance obtained by dividing the pitch of the light intensity unevenness by the number of times of the scan or intermittent movement in the X-axis direction.

According to the projection exposure apparatus and the projection exposure method of the first embodiment of the present invention shown in FIG. 5 through FIG. 7, since a scan or intermittent movement, and a movement in the Y-axis direction are also performed in addition to that a scan or intermittent movement in the X-axis direction are performed, by moving the gradient refractive index lens array 1 relatively to the exposed substrate 4, the exposed substrate 4 can be exposed in not only the X-axis direction but also the Y-axis direction while overlapping the exposure ranges multiple times.

Figure 8:
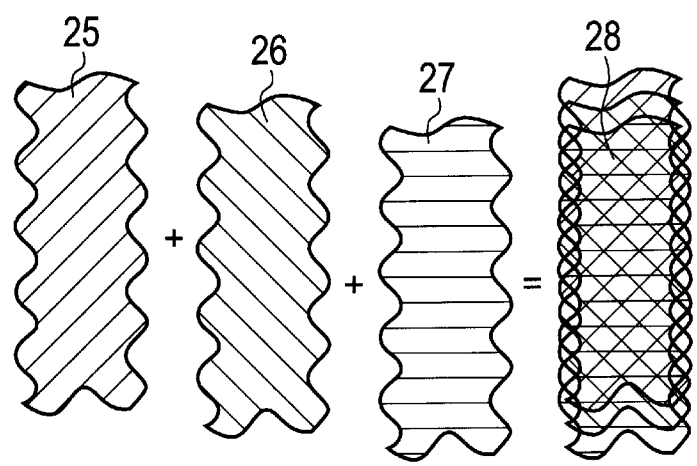
FIG. 8 is an explanatory view of overlapping of exposure ranges.

FIG. 8 is an explanatory view of overlapping of the exposure range according to the projection exposure apparatus and the projection exposure method of the first embodiment of the present invention. A case where a pattern on the same mask is overlappingly projection-exposed three times onto ranges 25, 26, and 27 by three irradiations of shifting a position little by little is illustrated. When the light exposure amounts overlapped by three times are totaled, light intensity within a projection exposure area 28 is approximately equalized.

According to the projection exposure apparatus and the projection exposure method of the present invention shown in FIG. 5 through FIG. 7, since it is projection exposure and the mask 3 and the exposed substrate 4 do not contact with each other, the occurrence of the transcription defect to the exposure pattern due to contamination adhesion on the mask in the close contact exposure or the proximity exposure, or the occurrence of scratches on the mask 3 or the exposed substrate 4 in the same can be reduced. Moreover, a clearance between the mask 3 and the exposed substrate 4 can be secured, and the exposed substrate 4 may be displaced in the Z direction in the range of the depth of focus, thus resulting in easy setting of the device.

Further, in the present first embodiment exposure is performed by not only moving the gradient refractive index lens array 1 relatively to the exposed substrate 4 in one axis direction of the X-axis, but also by performing the scan or intermittent movement also in the Y-axis direction in synchronization during the scan or intermittent movement in the X-axis direction so that the exposure areas may be overlapped, or by performing the scan or intermittent movement again after moving in the Y-axis direction upon movement completion in the X-axis direction so that the exposure areas may be overlapped, so that the entire exposure range of the exposed substrate is illuminated while overlapping the exposure ranges multiple times in not only the X-axis direction but also the Y-axis direction, and thus even when the light intensity distribution is non-uniform within the irradiation area of the exposure light emitted from the gradient refractive index lens array 1, the non-uniformity of the light intensity distribution can be reduced. As a result of this, it is possible to achieve equalization of the pattern line width and formation of the pattern with a smooth sidewall, allowing a finer pattern to be formed.

Figure 9:
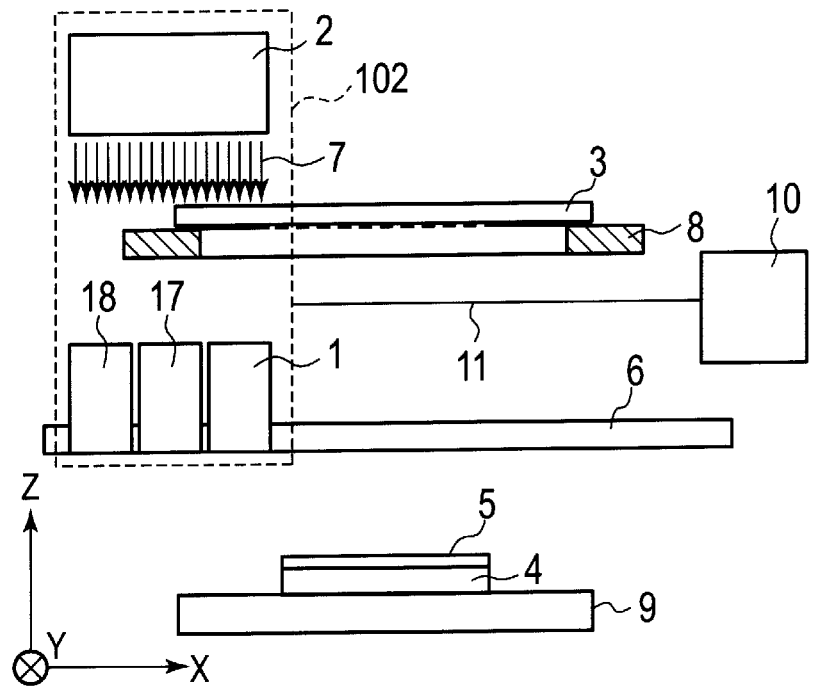
FIG. 9 is an explanatory view of a projection exposure apparatus of a second embodiment of the present invention.
Figure 10:
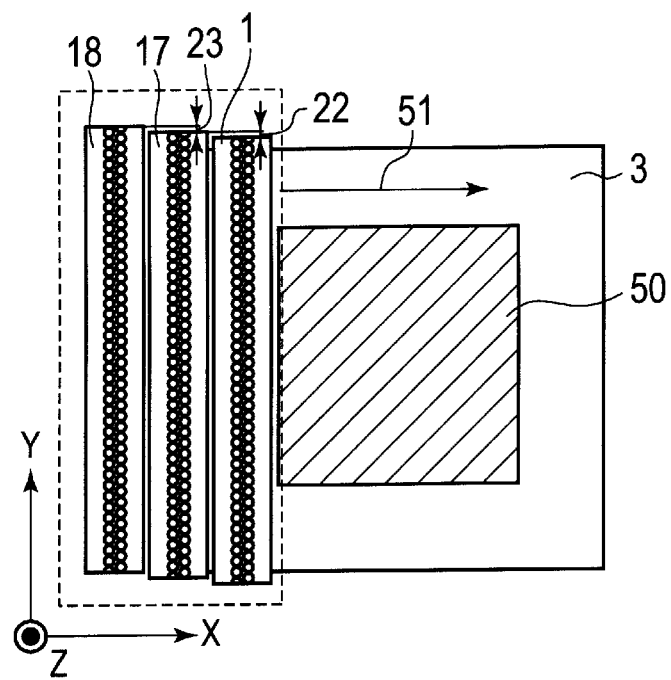
FIG. 10 is an explanatory view of a projection exposure method of the second embodiment of the present invention.

FIG. 9 is a projection exposure apparatus of a second embodiment of the present invention, while FIG. 10 is an explanatory view of a projection exposure method of the second embodiment thereof. The projection exposure apparatus shown in FIG. 9 differs from the projection exposure apparatus of the first embodiment of the present invention shown in FIG. 5 in that a plurality of gradient refractive index lens arrays are arranged in parallel to a direction of the arrangement of the lens elements (Y-axis direction), and the arrangement position is displacedly arranged in the direction of the arrangement of the lens elements (Y-axis direction). While FIG. 10 is the figure when FIG. 9 is viewed from the top, the gradient refractive index lens array 1 is drawn over the mask 3 for the purpose of easy understanding of the figure.

In FIG. 9, three gradient refractive index lens arrays are provided in the scanning direction as one example. Additionally, it is characterized in that the three gradient refractive index lens arrays 1, 17 and 18 are not alignedly arranged in the Y-axis direction simply, but are displacedly arranged as shown in FIG. 10.

While all that matters are amounts 22 and 23 for the gradient refractive index lens arrays 1, 17 and 18 shown in FIG. 10 to be displaced in the Y-axis direction here, there is unevenness of the light intensity distribution having a feature to appear periodically in the form of approximately corresponding to the geometric arrangement of the lens elements of the gradient refractive index lens array 1, 17 and 18, as lightness and darkness component on the imaging surface of the gradient refractive index lens array 1, 17 and 18 as shown in FIG. 4, and thus if the geometric arrangements of the lens elements of the gradient refractive index lens arrays 1, 17 and 18 are completely the same, it is more suitable to displace them by every distance obtained by dividing the pitch of the light intensity distribution by the number of arrangements of the gradient refractive index lens array, namely 3 in this case, in the Y-axis direction. When the geometric arrangements of the lens elements of the gradient refractive index lens arrays 1, 17 and 18 are displaced, it is effective to displace so that the geometric arrangements may be displaced by the same amount between the adjacent gradient refractive index lens arrays. Between the adjacent gradient refractive index lens arrays, if the geometric arrangement may be displaced by the same amount and may be displaced halfway to the array pitch, there is no problem even when it is displaced more than the pitch of the gradient refractive index lens array, but if it is displaced too largely, the exposure areas that can be overlappingly exposed will become narrow.

Needless to say, it is preferable that the amount 23 to be displaced in the Y-axis direction can be changed. For example, non-uniformity of light to be irradiated is changed depending on whether the lens array of the gradient refractive index lens array is an even number or an odd number. Moreover, since the non-uniformity of light to be irradiated is also changed depending on individual differences, it is needless to say that the higher a degree of freedom of the amount 23 displaced in the Y-axis direction is, the better it is.

Meanwhile, a large illuminating device 2 is arranged so that light may enter into the three gradient refractive index lens arrays 1, 17 and 18. Needless to say, it may be configured such that three illuminating devices are provided for every gradient refractive index lens arrays 1, 17 and 18, respectively.

The stage 6 for moving the gradient refractive index lens array in the X-axis direction is configured to integrally move the three gradient refractive index lens arrays 1, 17 and 18 in FIG. 9, even when it is configured that three gradient refractive index lens arrays 1, 17 and 18 are arranged on different stages, respectively, a configuration that they move in the X-axis direction simultaneously may be employed.

A dotted line 102 indicates a unit 102 in which the stage 6 on which the gradient refractive index lens arrays 1, 17 and 18 are mounted, and the illuminating device 2 move in synchronization or integrally with each other.

Since another configuration in FIG. 9 is the same as the projection exposure apparatus of the first embodiment of the present invention shown in FIG. 5, the same reference numeral is given to the same component as that of the projection exposure apparatus shown in FIG. 5, and description thereof will be omitted.

In order to perform exposure, the scan or intermittent movement 51 relative to the entire exposure area of the exposed substrate 4 is performed while the illuminating device 2, the mask 3, and the gradient refractive index lens arrays 1, 17 and 18 are synchronized or integrated with each other.

The light that is emitted from the illuminating device 2 passes through the mask, and enters into the respective gradient refractive index lens arrays 1, 17 and 18. Since the respective gradient refractive index lens arrays have a configuration movable in the X-axis direction simultaneously, the photosensitive material 5 on the exposed substrate 4 is overlappingly exposed by the exposure areas which are irradiated from the gradient refractive index lens arrays 1, 17 and 18 and whose positions are displaced little by little. As a result, similar to the projection exposure apparatus and the projection exposure method of the first embodiment of the present invention the exposure areas are overlapped and the light intensity is equalized as shown in FIG. 8 when it is schematically drawn.

Note that, although there is employed a configuration in which the gradient refractive index lens arrays 1, 17, and 18, and the illuminating device 2 move as the unit 102 to the exposed substrate 4 in the present embodiment, there may be employed a configuration in which the gradient refractive index lens arrays 1, 17, and 18, and the illuminating device 2 move relatively to the exposed substrate 4, such as a configuration in which the illuminating device 2 and the gradient refractive index lens array 1 are fixed, and the mask 3 and the exposed substrate 4 move.

Figure 11:
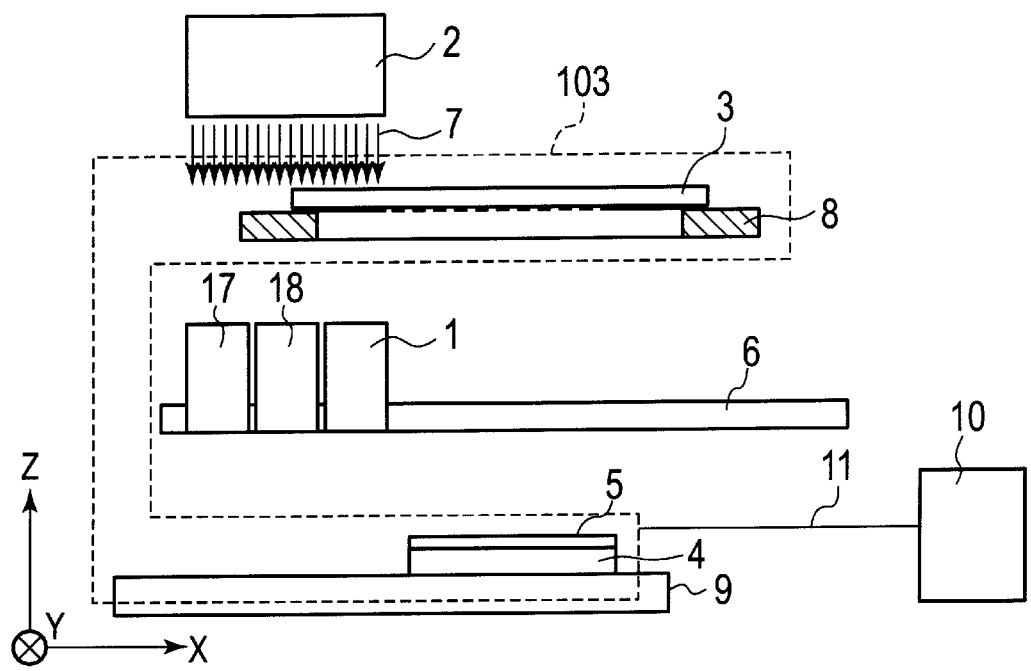
FIG. 11 is an explanatory view of another projection exposure apparatus of the second embodiment of the present invention.

FIG. 11 is another projection exposure apparatus of a second embodiment in which the gradient refractive index lens arrays 1, 17, and 18, and the illuminating device 2 are fixed, and the mask 3 and the exposed substrate 4 are moved. The stages 8 and 9 which move in synchronization and integrally with each other are constituted into a unit 103, and the mask 3 and the exposed substrate 4 are moved for scanning or intermittently moved in the X-axis direction, so that exposure in which the displaced exposure areas are overlapped is performed. The computer 10 controls the unit 103. A line 11 indicates that the unit 103 is connected to the computer 10 with a cable or the like to be controlled.

As described above, according to the projection exposure apparatus and the projection exposure method of the second embodiment of the present invention, a plurality of gradient refractive index lens arrays 1, 17, and 18 are displacedly arranged in the Y-axis direction between the mask 3 and the exposed substrates 4, the scan or intermittent movement relative to the entire exposure area of the exposed substrate 4 is performed while the illuminating device 2, the mask 3, and the gradient refractive index lens arrays 1, 17 and 18 are synchronized or integrated with each other, and the pattern formed on the mask 3 is projection-exposed, thereby an effect similar to that of the projection exposure apparatus of the first embodiment shown in FIG. 5 and FIG. 7 can be obtained.

Namely, since the exposed substrate 4 and the mask 3 do not contact with each other also in the projection exposure apparatus and the projection exposure method of the present invention of the second embodiment, the occurrence of the transcription defect to the exposure pattern due to contamination adhesion on the mask in the close contact exposure or the proximity exposure, or the occurrence of scratches on the mask 3 or the exposed substrate 4 in the same can be reduced. Moreover, the clearance between the mask 3 and the exposed substrate 4 can be secured, and the exposed substrate 4 may be displaced in the Z direction in the range of the depth of focus, thus resulting in easy setting of the device.

Further, the entire exposure range of the exposed substrate is illuminated not only in the X-axis direction but also in the Y-axis direction while overlapping the exposure ranges, and thus even when the light intensity distribution is non-uniform within the irradiation area of the exposure light emitted from the gradient refractive index lens array, the non-uniformity of the light intensity distribution can be reduced. As a result of this, it is possible to achieve equalization of the pattern line width and formation of the pattern with a smooth sidewall, allowing a finer pattern to be formed.

In the present second embodiment, since what is necessary is just to move the gradient refractive index lens arrays 1, 17 and 18 in one axis direction of the X-axis relatively to the exposed substrate 4, neither a movement mechanism or a movement process in the Y-axis direction is required, so that the device configuration and the exposure method become easy by just that much.

Moreover, since a plurality of gradient refractive index lens arrays are arranged, the exposure areas which can be exposed simultaneously are increased to thereby allow reducing exposure time.

Incidentally, although it has been described in FIG. 9 through FIG. 11 that there are three gradient refractive index lens arrays, the number of gradient refractive index lens arrays may be arbitrary, and thus it is needless to say that the further the number of lenses is increased, the higher a uniform effect within the exposure area and a reduction effect of the exposure time become.

Figure 12:
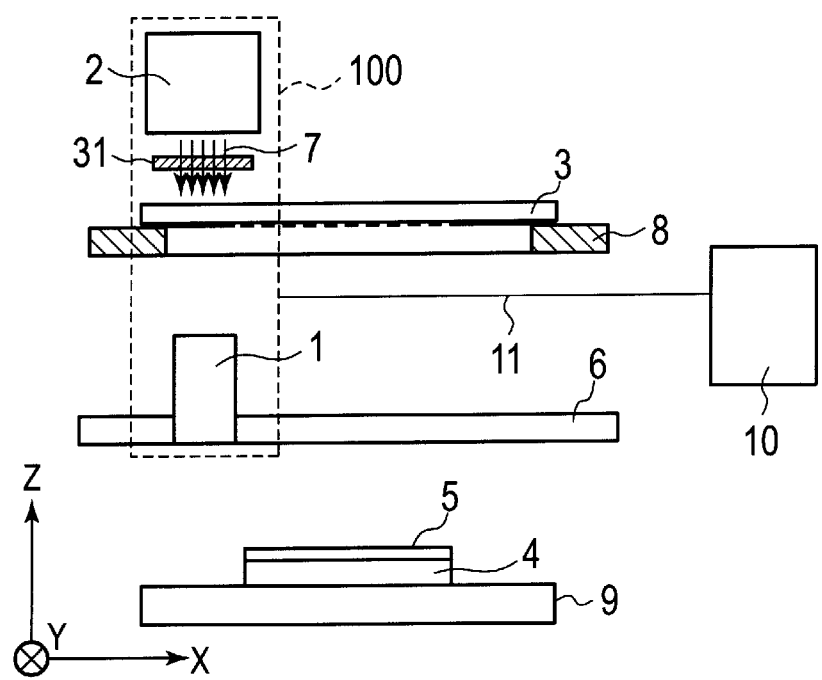
FIG. 12 is an explanatory view of a projection exposure apparatus and a projection exposure method of a third embodiment of the present invention.

FIG. 12 is an explanatory view of a projection exposure apparatus and a projection exposure method of a third embodiment of the present invention. In order to equalize the intensity distribution of light which enters into the gradient refractive index lens array 1, an optical filter 31 having light and dark density distribution is arranged between the illuminating device 2 and the mask 3. The optical filter 31 may be arranged near a plane conjugate to the pattern surface of the mask 3, such as just behind the mask, just before the exposed substrate 4, or the like.

The stage 6 which makes the gradient refractive index lens array 1 scan or intermittently move may move only in the X-axis direction at the minimum, and it is not necessary to necessarily move in the Y-axis direction.

Moreover, the mask 3 and the exposed substrate 4 may be moved for scanning or intermittently moved as making the configuration of the device similar to that in FIG. 7, and also in that case, the stage 8 and the stage 9 may move only in the X-axis direction at the minimum, and it is not necessary to necessarily move in the Y-axis direction.

Although the light intensity distribution on the image surface when uniformly illuminating the object surface by the gradient refractive index lens array 1 is dependent on the substance of the gradient refractive index lens array 1, it is always the same as far as a distance between the gradient refractive index lens array 1, and the object surface and an image surface is kept constant. Hence, based on a portion whose light intensity is comparatively weak, when the optical filter 31 which weakens light intensity of a portion whose light intensity is higher than that, corresponding to the distribution is inserted, non-uniformity of light intensity can be improved.

A tolerance limit of the non-uniformity of light intensity within an irradiation field is dependent on the size and shape of the pattern or the like to be projection-exposed. In the case of the fine pattern close to a resolution limit, the light and dark density distribution is adjusted so that the non-uniformity of light intensity of the light beam irradiated from the gradient refractive index lens array 1 may be ±1% or less within the irradiation field. Meanwhile, in the case of a relatively rough pattern, it is adjusted so that the non-uniformity of light intensity will be ±5% or less, for example.

According to the configuration described above, the light which has transmitted the optical filter 31 having the light and dark density distribution irradiates approximately uniformly the photosensitive material 5 on the exposed substrate 4 via the gradient refractive index lens array 1.

The projection exposure apparatus and the projection exposure method of the first embodiment and the second embodiment is particularly effective to a reduction of the non-uniformity of light intensity having periodicity resulting from the geometric arrangement of the lens elements of the gradient refractive index lens array 1, whereas the projection exposure apparatus and the projection exposure method of the present third embodiment is particularly effective to a reduction of an irregular non-uniformity of light intensity of the arrangement direction (Y-axis direction) of the lens elements of the gradient refractive index lens array 1.

According to the projection exposure apparatus and the projection exposure method of the third embodiment in which the optical filter 31 is inserted, since the exposed substrate 4 and the mask 3 do not contact with each other similar to the projection exposure apparatus and the projection exposure method of the first embodiment and the second embodiment, the occurrence of the transcription defect to the exposure pattern due to contamination adhesion on the mask in the close contact exposure or the proximity exposure, or the occurrence of scratches on the mask 3 or the exposed substrate 4 in the same can be reduced. Moreover, the clearance between the mask 3 and the exposed substrate 4 can be secured, and the exposed substrate 4 may be displaced in the Z direction in the range of the depth of focus, thus resulting in easy setting of the device. Moreover, since the non-uniformity of the light intensity distribution can be reduced by a function of the optical filter 31 even when the light intensity distribution of the exposure light emitted from the gradient refractive index lens array 1 is non-uniform, it is possible to achieve equalization of the pattern line width and formation of the pattern with a smooth sidewall, allowing a finer pattern to be formed.

Further, in the present third embodiment, since what is necessary is just to move the gradient refractive index lens array 1 in one axis direction of the X-axis relatively to the exposed substrate 4 similar to the projection exposure apparatus and the projection exposure method of the second embodiment of the present invention, neither a movement mechanism or a movement process in the Y-axis direction is required, so that the device configuration and the exposure method become easy by just that much.

FIG. 13 is an explanatory view of a projection exposure apparatus and a projection exposure method of a fourth embodiment of the present invention. As shown in FIG. 13 (a), an opening control plate 32 for limiting the light reaching the exposed substrate is arranged just behind the mask 3. The opening control plate 32 may be arranged near a plane conjugate to a mask surface, such as right above the exposed substrate 4 or the like.

As shown in FIG. 13 (b), the opening control plate 32 is formed from a shielding portion 33 and a transparent part 34 so that a projection range in a direction perpendicular to the lens arrangement direction of the gradient refractive index lens array 1 may be controlled. The shielding portion 33 and the transparent part 34 may be formed by applying a shielding material to a light transparent substrate, such as a glass or quartz plate, or the shielding portion 33 and the transparent part 34 may be formed by making a hole in a shielding plate, such as a metal plate or the like. Additionally, an arrangement of the opening control plate 32 is preferably set so that a medial axis in the lens arrangement direction of the gradient refractive index lens array 1 and a medial axis of the opening control plate 32 may be substantially coincident with each other.

According to the configuration described above, light passed the gradient refractive index lens array 1 is partially shielded by the opening control plate 32, and only light of a limited projection range is irradiated to the photosensitive material 5 on the exposed substrate 4.

The other configuration is similar to that shown in FIG. 5. However, the stage 6 which makes the gradient refractive index lens array 1 scan or intermittently move may move only in the X-axis direction at the minimum, and it is not necessary to necessarily move in the Y-axis direction.

Moreover, the mask 3 and the exposed substrate 4 may be moved for scanning or intermittently moved as making the configuration of the device similar to that in FIG. 7, and also in that case, the stage 8 and the stage 9 may move only in the X-axis direction at the minimum, and it is not necessary to necessarily move in the Y-axis direction.

According to the projection exposure apparatus and the projection exposure method of the fourth embodiment configured such that the opening control plate 32 is inserted, since the exposed substrate 4 and the mask 3 do not contact with each other similar to the projection exposure apparatus and the projection exposure method of the first embodiment and the second embodiment, the occurrence of the transcription defect to the exposure pattern due to contamination adhesion on the mask in the close contact exposure or the proximity exposure, or the occurrence of scratches on the mask 3 or the exposed substrate 4 in the same can be reduced. Moreover, the clearance between the mask 3 and the exposed substrate 4 can be secured, and the exposed substrate 4 may be displaced in the Z direction in the range of the depth of focus, thus resulting in easy setting of the device.

Since exposure is performed by using only an area of a central portion where the light intensity is uniform while limiting use of the peripheral portion of the exposure area where the light intensity distribution irradiated from the gradient refractive index lens array 1 is non-uniform, the non-uniformity of the light intensity distribution within the irradiation area can be reduced, and thus it is possible to achieve equalization of the pattern line width and formation of the pattern with a smooth sidewall, allowing a finer pattern to be formed.

Moreover, in the present fourth embodiment, since what is necessary is just to move the gradient refractive index lens array 1 in one axis direction of the X-axis relatively to the exposed substrate 4 similar to the projection exposure apparatus and the projection exposure method of the second embodiment and the third embodiment, neither a movement mechanism or a movement process in the Y-axis direction is required, so that the device configuration and the exposure method become easy by just that much.

Moreover, as will be hereinbelow described, when the transmission type microscopic shutter array or the reflection type microscopic shutter array is used instead of the mask 3, or when a fine light emitting element array is used instead of the illuminating device 2 and the mask 3, an opening is limited in the direction perpendicular to the arrangement direction of the lens elements of the gradient refractive index lens array 1, thus it becomes possible to limit the size of the pattern of various arrays substituting the mask 3 in the direction perpendicular to the direction of the arrangement of the lens elements, namely, the X-axis direction, thereby making it possible to improve transcription resolution in this direction.

Moreover, among the projection exposure apparatuses and the projection exposure methods of the first embodiment through the fourth embodiment of the present invention two or more arbitrary embodiments may be used together. Namely, among installation of a mechanism for moving the gradient refractive index lens array 1 in the direction perpendicular to the direction of scan or intermittent movement relative to the exposed substrate 4 during exposure or an exposure process, arrangement in which a plurality of gradient refractive index lens arrays are provided in the direction of scan or intermittent movement, and the arrangement positions are displaced in the direction of the arrangement of the lens elements, installation of the optical filter having the light and dark density distribution between the illuminating device 2 and the mask 3, just behind the mask 3, or near the plane conjugate to the pattern surface of the mask 3, or installation of the opening control plate for controlling the projection range in the direction perpendicular to the direction of the arrangement of the lens elements of the gradient refractive index lens array just behind the mask 3 or near the plane conjugate to the pattern surface of the mask 3, at least two or more may be carried out simultaneously.

By using two or more measures for equalizing the light intensity together, the non-uniformity of light intensity within the exposure area is further improved.

Figure 15:
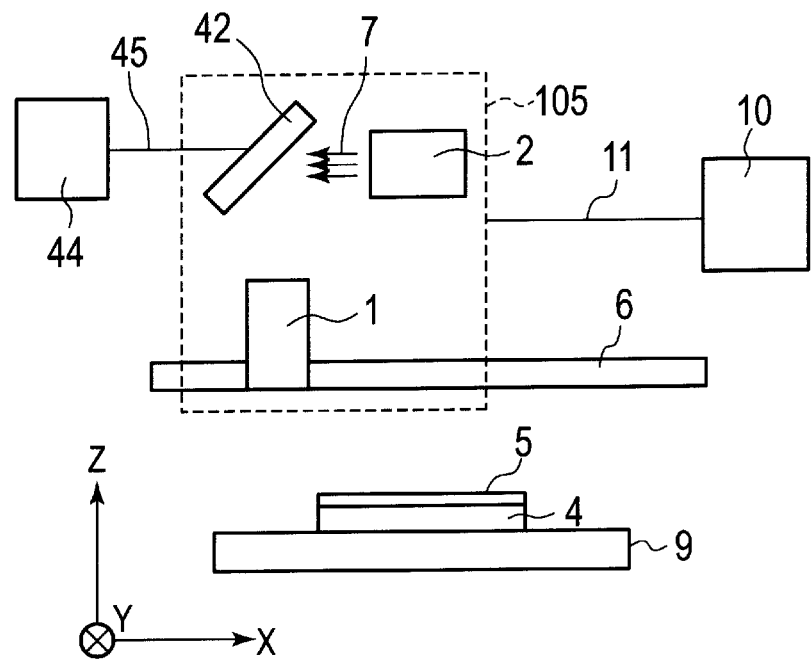
FIG. 15 is an explanatory view of the projection exposure apparatus of the first embodiment in which a reflection type microscopic shutter array is used.
Figure 16:
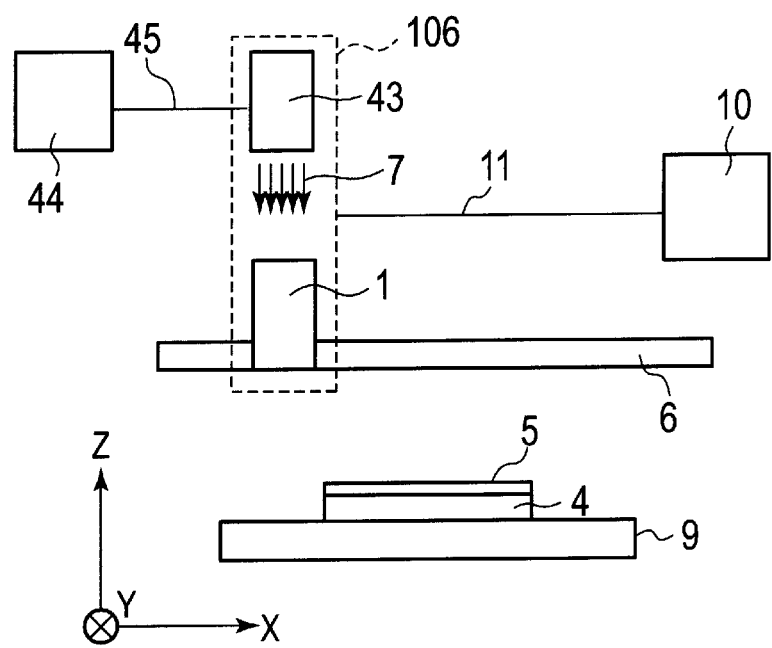
FIG. 16 is an explanatory view of the projection exposure apparatus of the first embodiment in which a microscopic light emitting element array is used.

Incidentally, in the first embodiment through the fourth embodiment of the aforementioned exposure apparatuses of the present invention, if a transmission type microscopic shutter arrays 41, such as a liquid crystal panel or the like is used as shown in FIG. 14, or if a reflection type microscopic shutter arrays 42, such as a digital mirror device, a spatial light modulator, or the like is used as shown in FIG. 15, instead of using a master pattern substrate as the mask 3, such as a mask in which a pattern is formed of a shielding material, such as chromium or the like, on a transparent substrate, such as quartz, glass, or the like, and a stencil mask in which holes with a pattern shape are made in a metal plate, it is further effective. Additionally, as shown in FIG. 16, even when a microscopic light emitter array 43, such as an array in which microscopic light emitting elements, such as light emitting diodes, laser diodes, or electroluminescence light emitting devices are arranged, or an optical fiber array which is connected to an arbitrary light source device and can control lightness and darkness of the light emitting end is used instead of the illuminating device 2 and the mask 3, it is effective.

FIG. 14(*a*) shows a projection exposure apparatus of the first embodiment using the transmission type microscopic shutter array 41 instead of the mask 3. In order to specify a pattern shape on the transmission type microscopic shutter array 41, a pattern specification unit is provided. The pattern specification unit 44 is composed of a display for displaying pattern information as the pattern shape, a keyboard for giving instructions, a computer for processing, storing, and inspecting the pattern information, or the like. A line 45 indicates that the pattern specification unit 44 is connected to the transmission type microscopic shutter array 41 with a cable or the like.

Switching between light transmission state and light shield state and/or change of a transmission amount of the illumination light in cells constituting the microscopic shutter array are performed by the pattern specification unit 44, and lightness and darkness distribution is formed in an emitting light from the microscopic shutter array to thereby use lightness and darkness distribution as the mask pattern.

In the present embodiment, the transmission type microscopic shutter array 41 serves as a unit 104 together with the gradient refractive index lens array 1 and the illuminating device 2, and moves in synchronization or integrally relatively to the exposed substrate 4 simultaneously.

Instead of moving the unit 104 in synchronization or integrally, the exposed substrate 4 may be moved by the stage 9 while fixing the unit 104.

The transmission type microscopic shutter array 41 can change the pattern into arbitrary pattern shapes by signals from the pattern specification unit 44 in accordance with the scan or intermittent movement of the gradient refractive index lens array 1 relative to the exposed substrate 4 during exposure. For this reason, a size of the transmission type microscopic shutter array 41 may be equal to a size of a visual field range of the gradient refractive index lens array 1, and an arrangement in the X direction may be one line to several lines. By changing the pattern shape in accordance with the scan or intermittent movement of the gradient refractive index lens array 1 relative to the exposed substrate 4, two-dimensional patterns can be created on the exposed substrate 4.

While it cannot be overemphasized that the projection exposure apparatus of the present invention shown in the FIG. 14(*a*) constituted as described above has a similar effect to that of the aforementioned embodiment shown in FIG. 5 and FIG. 7, switching between light transmission state and light shield state and change of the transmission amount of the illumination light of the transmission type microscopic shutter array 41 are simply become possible by the pattern shape created by the pattern specification unit 44, thus allowing patterns with arbitrary shapes to be exposed without using the master pattern substrate, such as a mask in which alight shielding film pattern is applied to the transparent substrate, a stencil mask, or the like, which is indispensable to the conventional projection exposure apparatus. Hence, since the master pattern substrate which is expensive and takes time for creation is not used, it is possible not only to reduce a cost of a product, but also to significantly reduce an amount of time required after pattern design to exposure.

Additionally, since the size of the transmission type microscopic shutter array 41 may be equal to the size of the visual field range of the gradient refractive index lens array 1, arbitrary two-dimensional patterns can be exposed to the exposed substrate 4 when a series of cells 46 of the transmission type microscopic shutter array 41 is arranged at least by one line in the direction perpendicular to the arrangement direction of the lens elements of the gradient refractive index lens array 1 as shown in FIG. 14(*b*), so that it is possible to remarkably reduce the apparatus in size.

Meanwhile, when a common two-dimensional liquid crystal panel is used instead of the mask 3 and the pattern is formed as a result of exposing for a predetermined exposure time using a projection optical system, such as a projection lens optical system in which lenses are arranged in series in combination with each other within a lens-barrel, a projection mirror optical system by a combination of mirrors, a projection optical system by a combination of both lenses and mirrors, a black matrix portion between liquid crystal cells always serves as the shielding portion, and thus constricted parts appear in a replicated positive resist pattern in a position corresponding to the black matrix portion, or bulged parts appear in a replicated negative resist pattern.

In contrast to that, according to the embodiment of the present invention, not only by moving the gradient refractive index lens array 1 relatively to the exposed substrate 4 in one axis direction of the X-axis, but also by performing the scan or intermittent movement also in the Y-axis direction in synchronization during the scan or intermittent movement in the X-axis direction so that the exposure areas may be overlapped or by performing the scan or intermittent movement again after moving in the Y-axis direction upon movement completion in the X-axis direction so that the exposure areas may be displaced and overlapped, the entire exposure range of the exposed substrate is illuminated while overlapping the exposure ranges multiple times in not only the X-axis direction but also the Y-axis direction, and thus if exposure of displacing the black matrix portion is repeated, an influence due to a black matrix can be reduced.

Further, since the transmission type microscopic shutter array 41 may arrange the series of the cells 46 by at least one line in the X-axis direction, it becomes unnecessary to provide a driver wire between each cells 46, or to provide a transistor for drive within the cell 46, and these components be arranged in an area 47 outside the arrangement of the cells 46. As a result of this, a space 48 between cells 46 can be reduced. In addition, a black matrix width between the cells 46 can be narrowed.

For this reason, it becomes advantageous to increase display resolution to the lens arrangement direction of the gradient refractive index lens array 1, thus allowing more fine pattern shapes to be specified. Moreover, since the black matrix width between the cells 46 is narrow, it is possible to reduce more an effect of joints between the cells 46 against a pattern image formed on the exposed substrate 4.

Further, the transmission type microscopic shutter array 41 can arbitrarily change the pattern shape and lightness and darkness by the signals from the pattern specification unit 44 in accordance with the scan or intermittent movement of the gradient refractive index lens array 1 relative to the exposed substrate 4 during exposure, and thus when specification of a transmission distribution is added to the transmission type microscopic shutter array 41 in order to cancel the non-uniformity of the light intensity distribution caused by the combination of the gradient refractive index lens array 1 and the illuminating device 2, equalization of exposure can be further achieved.

FIG. 11 shows the projection exposure apparatus of the first embodiment of the present invention using not the transmission type microscopic shutter array 41 shown in FIG. 14(a) but the reflection type microscopic shutter array 42 instead of the mask 3.

A illumination light reflected by reflective elements constituting the reflection type microscopic shutter array forms lightness and darkness distribution in an emitting light from the microscopic shutter array by switching of whether or not to pass through the gradient refractive index lens array and/or change of an amount of the illumination light passing therethrough to thereby use lightness and darkness distribution as a mask pattern.

The reflection type microscopic shutter array 42 serves as a unit 105 together with the gradient refractive index lens array 1 and the illuminating device 2, and is made to move in synchronization or integrally relatively to the exposed substrate 4 simultaneously.

Instead of moving the unit 105 in synchronization or integrally, the exposed substrate 4 may be moved by the stage 9 while fixing the unit 105.

Since the transmission type microscopic shutter array 41 is only changed to the reflection type microscopic shutter array 42 and other configurations are the same as those shown in FIG. 14(a), and operations, effects, or the like are similar to the case where the transmission type microscopic shutter array 41 is used, description thereof will be omitted.

Incidentally, the reflection type microscopic shutter array 42 can also change the pattern into an arbitrarily pattern shape, and lightness and darkness by the signals from the pattern specification unit 44 in accordance with the scan or intermittent movement of the gradient refractive index lens array 1 relative to the exposed substrate 4 during exposure, and thus when specification of reflecting distribution is added thereto in order to cancel the non-uniformity of the light intensity distribution caused by the combination of the gradient refractive index lens array 1 and the illuminating device 2, equalization of exposure can be further achieved.

Further, as shown in FIG. 16, a microscopic light emitter array 43, such as an array in which microscopic light emitters, such as light emitting diodes, laser diodes, or electroluminescence light emitting devices are arranged, or an optical fiber array which is connected to an arbitrary light source device and can control lightness and darkness of the light emitting end may be used instead of the illuminating device 2 and the mask 3.

While performing switching of whether or not to make the microscopic light emitters emit light and/or change of an amount of emitting light, using lightness and darkness distribution of an emitting light from the microscopic light emitters as a mask pattern, the mask pattern is projected onto the exposed substrate by the gradient refractive index lens array, and the gradient refractive index lens array performs the scan or intermittent movement relatively to the exposed substrate to thereby perform projection exposure.

The microscopic light emitter array 43 serves as a unit 106 together with the gradient refractive index lens array 1 and the illuminating device 2, and is made to move in synchronization or integrally relatively to the exposed substrate 4 simultaneously.

Instead of moving the unit 106 in synchronization or integrally, the exposed substrate 4 may be moved by the stage 9 while fixing the unit 106.

While operations, effects, or the like are similar to the case of FIG. 14(a) where the transmission type microscopic shutter array 41 is used, the illuminating device becomes unnecessary, thus the projection exposure apparatus can be made simpler and smaller.

Moreover, since the microscopic light emitter array 43 can also arbitrarily change the pattern shape and lightness and darkness by the signals from the pattern specification unit 44 in accordance with the scan or intermittent movement of the gradient refractive index lens array 1 relative to the exposed substrate 4 during exposure, equalization of exposure can be further achieved when specification of a luminous distribution is added thereto in order to cancel the non-uniformity of the light intensity distribution caused by the combination of the gradient refractive index lens array 1 and the illuminating device 2.

It is clear that, also in the second embodiment, the third embodiment, and the fourth embodiment of the present invention, the transmission type microscopic shutter arrays 41, such as a liquid crystal panel or the reflection type microscopic shutter arrays 42, such as a digital mirror device and a spatial light modulator can be used instead of the mask 3, or the microscopic light emitter array 43, such as an array of light emitting diodes, laser diodes, and electroluminescence light emitting devices, an optical fiber array which is connected to an arbitrary light source device and can control lightness and darkness of the light emitting end, or the like can be used instead of the illuminating device 2 and the mask 3.

To restrict a size in the X-axis direction of the transmission type microscopic shutter array 41, the reflection type microscopic shutter array 42, or the microscopic light emitter array 43 which is used instead of the mask 3 to a small value using the opening control plate 32 according to the fourth embodiment is particularly effective to miniaturize a transcription pattern size or to increase transcription accuracy of the pattern.

Since many of the transmission type microscopic shutter arrays 41, such as a liquid crystal panel for a display and the reflection type microscopic shutter arrays 42, such as a digital mirror device are developed for color displays, three cells of red, blue, and green are arranged horizontally to form one square pixel, and thus the cell has a vertically long size of near 3:1 in many cases. When this is used for monochrome of a wavelength suitable for exposure and the cell size in a long direction is restricted using the opening control plate 32, it can be used as a microscopic cell, and thus the resolution of pattern formation can be significantly increased.

EXAMPLES

The projection exposure apparatus of the configuration shown in FIG. 5 of the first embodiment of the present invention could be achieved by using SLA (SELFOC lens array) made by Nippon Sheet Glass Co., Ltd. in which a diameter and the number of lines of the lens element are 1.1 millimeters and 2, respectively as the gradient refractive index lens array 1, a halogen lamp made by Sumita Optical Glass, Inc. as the illuminating device 2, and a notebook PC as the computer 10.

While the gradient refractive index lens array 1 used for the experiment has resolution performance capable of forming a line and space with a line width of 5 to 10 micrometers on an exposed substrate in which a positive resist made by TOKYO OHKA KOGYO CO., LTD. is coated on a silicon wafer at a film thickness of 1 micrometer when projection exposure is performed while keeping it to stand still, it has a size of about 195 millimeters in width, about 5 millimeters in thickness, and about 16 millimeters in height, and it is small in size and light in weight, such as 0.4N of weight, and is a low price of 10,000 yen or less per unit.

In a projection optical system, such as a projection lens optical system in which lenses are arranged in series in combination with each other within a lens-barrel, a projection mirror optical system by a combination of mirrors, a projection optical system by a combination of both lenses and mirrors, or the like, a price of a system capable of projecting an area with a width of 195 millimeters or more in a resolution of 10 micrometers or less is several millions yen or more. Moreover, since the system is assumed to have a dimension of 250 millimeters or more in external size, 400 millimeters or more in length, and 200 N or more in weight, significant reduction in cost, and in size and weight can be achieved by the present invention using the gradient refractive index lens array.

Figure 17:
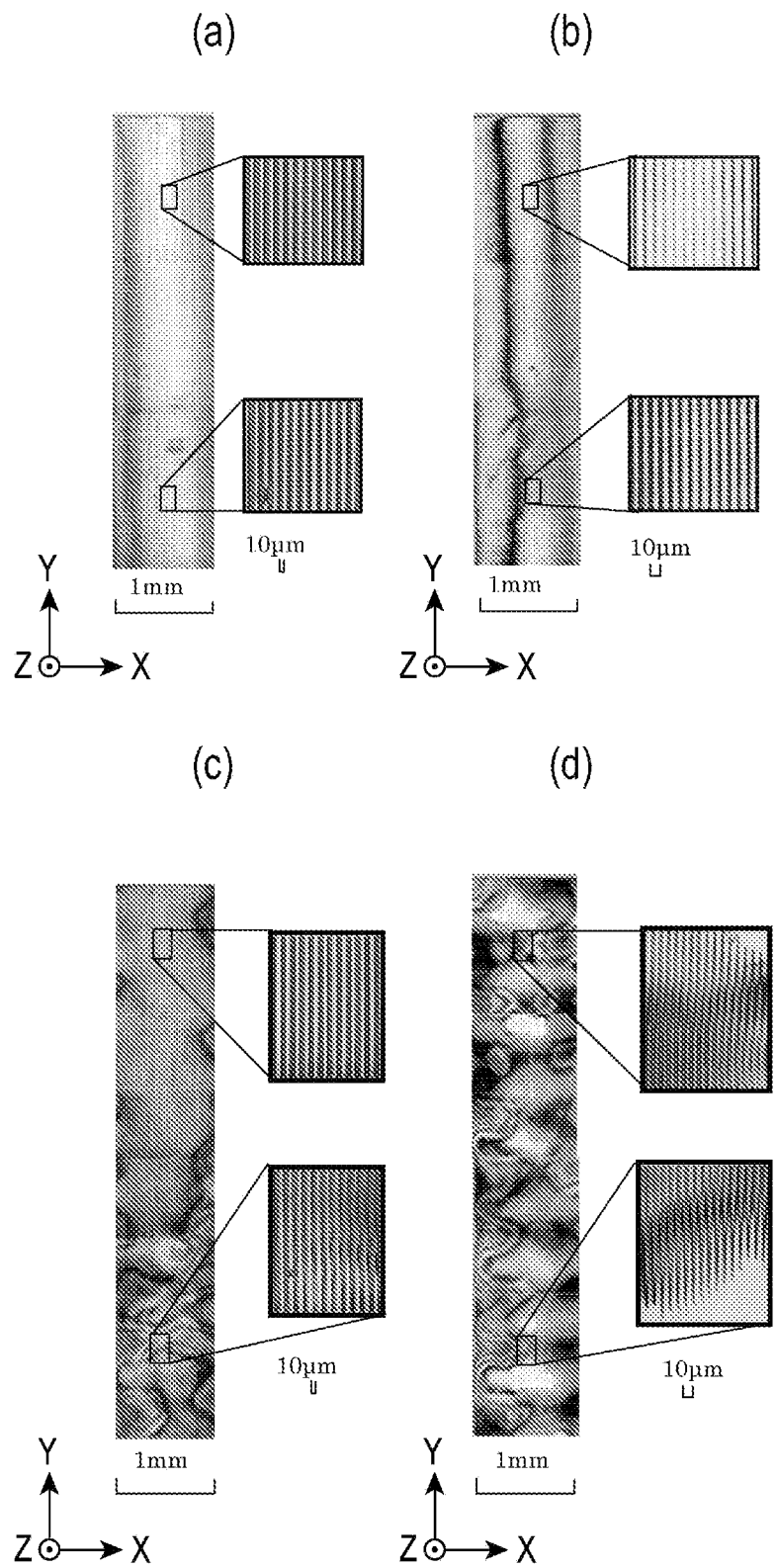
FIG. 17 is microphotographs showing results of experiments performed in order to show effectiveness of the present invention.

FIG. 17 is microphotographs showing results of the experiment performed to prove that the scan or intermittent movement of the gradient refractive index lens 1 in the Y-axis direction which is the feature of the present invention is effective.

In this experiment, SLA (SELFOC lens array) made by Nippon Sheet Glass Co., Ltd. in which a diameter and the number of lines of the lens element are 1.1 millimeters and 2, respectively) is used as the gradient refractive index lens 1, a halogen lamp made by Sumita Optical Glass, Inc. is used as the illuminating device 2, and a silicon wafer with a thickness of 525 micrometers on which a positive resist THMR-iP3300 made by TOKYO OHKA KOGYO CO., LTD. is coated at a film thickness of about 1 micrometer is used as the exposed substrate 4.

In this experiment, in order to detect more accurately the influence of the scan or intermittent movement in the Y-axis direction, the projection exposure apparatus of the configuration shown in FIG. 5 of the first embodiment of the present invention does not scan in the X-axis direction during exposure, and a pattern formed when exposure is performed by reciprocately moving the gradient refractive index lens 1 in the Y-axis direction with a speed of about ⅛ Hz, and a pattern formed when exposure is performed by keeping it to stand still without reciprocately moving in the Y-axis direction are compared with each other. After the exposure, the exposed substrate 4 is immersed in a developing solution NMD-W made by TOKYO OHKA KOGYO CO., LTD. to thereby be rinsed with pure water, and then a 10-micrometer line and space pattern and a 5-micrometer line and space pattern which were replicated are observed with an optical microscope.

The 10-micrometer line and space pattern in FIG. 17(a) and the 5-micrometer line and space pattern in FIG. 17(b) are patterns formed when exposure is performed by reciprocately moving the gradient refractive index lens 1 in the Y-axis direction with a speed of about ⅛ Hz without scanning in the X-axis direction during exposure. Meanwhile, the 10-micrometer line and space pattern in FIG. 17(c) and the 5-micrometer line and space pattern in FIG. 17(d) are patterns formed when exposure is performed by not reciprocately moving the gradient refractive index lens 1 in the Y-axis direction, namely, keeping it to stand still, without scanning in the X-axis direction during exposure.

In FIG. 17(c) and FIG. 17(d) in which the reciprocation in the Y-axis direction did not performed, away that the photoresist is exposed periodically changes in the Y-axis direction, and the pattern was resolved in only a local area.

A change cycle in the Y-axis direction of the way that the photoresist is exposed is coincident with a cycle of the arrangement of the gradient refractive index lens 1. In contrast to that, when exposure is performed by reciprocately moving the gradient refractive index lens 1 in the Y-axis direction with a speed of about ⅛ Hz exposure in the Y-axis direction is far equalized as compared with that shown in FIG. 17(c) and FIG. 17(d), and thus the pattern was resolved approximately equally in the entire range in the Y-axis direction.

Incidentally, the reason why the exposure range in the X-axis direction is narrow is scan is not performed in the X-axis direction during exposure. As is apparent from the aforementioned description, according to the projection exposure apparatus and the projection exposure method of the present invention, since it is the projection exposure and the mask and the exposed substrate do not contact with each other, the occurrence of the transcription defect to the exposure pattern due to contamination adhesion on the mask in the close contact exposure or the proximity exposure, or the occurrence of scratches on the mask or the exposed substrate in the same can be reduced. Moreover, the clearance between the mask and the exposed substrate can be secured, and the exposed substrate may be displaced in the Z direction in the range of the depth of focus, thus resulting in easy setting of the device.

Moreover, since exposure is performed by forming an erecting real image with equal-size by the gradient refractive index lens array, a mechanism of moving the mask and the exposed substrate in opposite directions while precisely synchronizing them with each other like the conventional projection exposure apparatus which exposes by forming an inverted real image is unnecessary, thus allowing the scan or intermittent movement mechanism of the apparatus and its control to be significantly simplified.

Further, according to the projection exposure apparatus and the projection exposure method of the present invention, exposure is performed by not only moving the gradient refractive index lens array relatively to the exposed substrate in one axis direction of the X-axis, but also by performing the scan or intermittent movement also in the Y-axis direction in synchronization during the scan or intermittent movement in the X-axis direction so that the exposure areas may be overlapped or by performing the scan or intermittent movement again after moving in the Y-axis direction upon movement completion in the X-axis direction so that the exposure areas may be overlapped, so that the entire exposure range of the exposed substrate is illuminated while overlapping the exposure ranges multiple times in not only the X-axis direction but also the Y-axis direction, and thus even when the light intensity distribution is non-uniform within the irradiation area of the exposure light emitted from the gradient refractive index lens array, the nonuniformity of the light intensity distribution can be reduced. As a result of this, it is possible to achieve equalization of the pattern line width and formation of the pattern with a smooth sidewall, allowing a finer pattern to be formed.

Further, according to the projection exposure apparatus of the present invention, the entire exposure range of the exposed substrate is illuminated while overlapping the exposure ranges in not only the X-axis direction but also the Y-axis direction using a plurality of gradient refractive index lens arrays, so that even when the light intensity distribution is non-uniform within the irradiation area of the exposure light emitted from the gradient refractive index lens array, the nonuniformity of the light intensity distribution can be reduced. As a result of this, it is possible to achieve equalization of the pattern line width and formation of the pattern with a smooth sidewall, allowing a finer pattern to be formed.

In addition, since what is necessary is just to simultaneously move a plurality of gradient refractive index lens arrays in one axis direction of the X-axis relatively to the exposed substrate, neither a movement mechanism or a movement process in the Y-axis direction is required, so that the device configuration and the exposure method become easy by just that much.

Further, according to the projection exposure apparatus of the present invention, since the non-uniformity of the light intensity distribution within the irradiation area caused when the light passes the gradient refractive index lens array can be reduced by providing the optical filter having the light and dark density distribution, it is possible to achieve equalization of the pattern line width and formation of the pattern with a smooth sidewall, allowing a finer pattern to be formed.

Moreover, since what is necessary is just to move the gradient refractive index lens array in one axis direction of the X-axis relatively to the exposed substrate, neither a movement mechanism or a movement process in the Y-axis direction is required, so that the device configuration and the exposure method become easy by just that much.

Further, according to the projection exposure apparatus of the present invention, since exposure is performed by using only an area of a central portion where the light intensity is uniform while limiting by the opening control plate use of the peripheral portion of the exposure area where the light intensity distribution irradiated from the gradient refractive index lens array 1 is non-uniform, the non-uniformity of the light intensity distribution within the irradiation area can be reduced, and thus it is possible to achieve equalization of the pattern line width and formation of the pattern with a smooth sidewall, allowing a finer pattern to be formed.

Moreover, since what is necessary is just to move the gradient refractive index lens array in one axis direction of the X-axis relatively to the exposed substrate, neither a movement mechanism or a movement process in the Y-axis direction is required, so that the device configuration and the exposure method become easy by just that much.

Further, as will be hereinbelow described, when the transmission type microscopic shutter array or the reflection type microscopic shutter array is used instead of the mask, or when a fine light emitting element array is used instead of the illuminating device 2 and the mask 3, an opening is limited in the direction perpendicular to the arrangement direction of the lens elements of the gradient refractive index lens array, thus it becomes possible to limit the size of the pattern of various arrays substituting the mask in the direction perpendicular to the direction of the arrangement of the lens elements, namely, the X-axis direction, thereby making it possible to improve transcription resolution in this direction.

Further, according to the projection exposure apparatus of the present invention, among installation of a mechanism for moving the gradient refractive index lens array in the direction perpendicular to the direction of scan or intermittent movement relatively to the exposed substrate during exposure or an exposure process, arrangement in which a plurality of gradient refractive index lens arrays are provided in the direction of scan or intermittent movement, and the arrangement positions are displaced in the direction of the arrangement of the lens elements, installation of the optical filter having the light and dark density distribution between the illuminating device and the mask, just behind the mask, or near the plane conjugate to the pattern surface of the mask, and installation of the opening control plate for controlling the projection range in the direction perpendicular to the direction of the arrangement of the lens elements of the gradient refractive index lens array just behind the mask or near the plane conjugate to the pattern surface of the mask, at least two or more measures of the light intensity equalization can be simultaneously implemented, so that the non-uniformity of light intensity within the exposure area is further improved.

Moreover, according to the projection exposure apparatus of the present invention, the mask pattern is projection-exposed on the exposed substrate by the gradient refractive index lens array using lightness and darkness distribution of the emitting light from the transmission type microscopic shutter array, the reflection type microscopic shutter array, or the microscopic light emitter array as the mask pattern, thus allowing patterns with arbitrary shapes to be exposed without using the master pattern substrate, such as a mask in which a light shielding film pattern is applied to the transparent substrate, a stencil mask, or the like, which is indispensable to the conventional projection exposure apparatus. Hence, since the master pattern substrate which is expensive and takes time for creation is not used, it is possible not only to reduce a cost of a product, but also to significantly reduce an amount of time required after pattern design to exposure.

Moreover, since the transmission type microscopic shutter array, the reflection type microscopic shutter array, and the microscopic light emitter array may have a size equivalent to a visual field range of the gradient refractive index lens array, it is possible to remarkably reduce the apparatus in size.

Further, according to the projection exposure apparatus of the present invention, since the transmission type microscopic shutter array, the reflection type microscopic shutter array, or the microscopic light emitter array may arrange cells for constituting the array in at least one line in the direction of scan or intermittent movement of the gradient refractive index lens array relative to the exposed substrate for exposure, it becomes unnecessary to provide a driver wire between each cells, or to provide a transistor for drive within the cell, and these components be arranged in an area outside the arrangement of the cells. For that reason, the space 48 between the cells can be reduced.

For this reason, it becomes advantageous to increase display resolution to the direction of the arrangement of the lens elements of the gradient refractive index lens array, thus allowing finer pattern shapes to be specified.

Since the black matrix width, which is a normally dark area, between the cells, can be narrowed, it is possible to reduce the effect of the joints between the cells against the pattern image formed on the exposed substrate.

Further, since a large number of array elements may be arranged only in the direction of the arrangement of the lens elements (Y-axis direction) of the gradient refractive index lens array, the transmission type microscopic shutter array, the reflection type microscopic shutter array, or the microscopic light emitter array which is large-scaled only in that direction is applicable, it becomes more easy to deal with a large area.

Further, according to the projection exposure apparatus of the present invention, since the transmission type microscopic shutter array, the reflection type microscopic shutter array, or the microscopic light emitter array can change the pattern into arbitrary pattern shape, and lightness and darkness in accordance with the scan or intermittent movement of the gradient refractive index lens array relative to the exposed substrate during exposure, equalization of exposure can be further achieved when specification of lightness and darkness distribution is added thereto in order to cancel the non-uniformity of the light intensity distribution caused by the combination of the gradient refractive index lens array and the illuminating device.

Moreover, by moving the transmission type microscopic shutter array, the reflection type microscopic shutter array, or the microscopic light emitter array in the direction perpendicular to the direction of the scan or intermittent movement for the exposure so that the exposure areas may be displacedly overlapped in synchronization with the scan or intermittent movement of the gradient refractive index lens array relative to the exposed substrate for exposure, exposure is performed while overlapping the exposure ranges multiple times, and thus if exposure of displacing the black matrix portion is repeated, an influence due to a black matrix can be reduced.

INDUSTRIAL APPLICABILITY

According to the present invention, fine patterns can be replicated on exposed substrates with large area, such as a large sized glass substrate, a plastic substrate, a plastic substrate with copper foil, a screen for screen-printing, a metal sheet, a large-diameter wafer, or the like by a very simple, small, and cheap apparatus.

Hence, if the present invention is applied to the manufacturing of semiconductor integrated circuits, optoelectronics devices, flexible printed circuit sheets, printed circuit boards, screens for screen-printing, encoders, micromachine parts, or the like, it is possible to achieve a reduction in cost of the products, a reduction in size due to high integration, and an improvement in performance.

Moreover, according to the projection exposure apparatus and the projection exposure method of the present invention using the transmission type microscopic shutter array, the reflection type microscopic shutter array, or the microscopic light emitter array, since arbitrary mask patterns can be easily specified immediately from the pattern specification unit, waiting time caused by the mask design and production can be eliminated, so that the time required to manufacture above-described products can be reduced significantly. If the present invention is utilized for the manufacturing of a wide variety of products in small quantities, it is effective to achieve QTAT (Quick Turn Around Time).

The invention claimed is:

1. An apparatus comprising:
   a mask on which a pattern is formed;
   an illuminating device configured to illuminate the mask to form a projected pattern from the pattern;
   an exposed substrate;
   a gradient refractive index lens array positioned between the mask and the exposed substrate;
   a first movement mechanism configured to:
   move the gradient refractive index array across an area of the exposed substrate in a first direction on a two dimensional plane that is parallel to the exposed substrate; and
   move the gradient refractive index lens array across the area of the exposed substrate in a second direction on the two dimensional plane to provide uniform exposure of the exposed substrate to the projected pattern, wherein the second direction is perpendicular to the first direction.

2. The apparatus according to claim 1, wherein the mask on which the pattern is formed is a transmission type shutter array comprising a plurality of shutters, wherein each of the plurality of shutters is configured to open and close, wherein light is transmitted through an open shutter, and wherein light is not transmitted through a closed shutter, and wherein the apparatus further comprises a processor configured to control the plurality of the shutters to form the pattern on the mask.

3. The apparatus according to claim 1, wherein the mask on which the pattern is formed is a reflection type shutter array comprising a plurality of shutters, wherein each of the plurality of shutters is configured to open and close, and further comprising a processor configured to control the plurality of shutters to form the pattern on the mask.

4. The apparatus according to claim 1, wherein the mask and the illuminating device form a light emitter array comprising a plurality of light emitters, wherein each of the plurality of light emitters is configured to be turned on or off, wherein light is emitted when the light emitter is on, and wherein light is not emitted when the light emitter is off, and further comprising a processor configured to control the plurality of light emitters to form the pattern on the mask.

5. The apparatus according to claim 4, wherein the processor is further configured to turn on or turn off each of the plurality of the light emitters to form the pattern on the mask while the exposed substrate is exposed to the projected pattern.

6. The apparatus according to claim 1, further comprising one or more additional gradient refractive index lens arrays adjacent to the gradient refractive index lens array and configured to move with the gradient refractive index lens array.

7. The apparatus according to claim 1, further comprising a control plate mechanism positioned below the gradient refractive index lens array and configured to limit the projected pattern to a location that is directly under the gradient refractive index lens array.

8. The apparatus according to claim 1, wherein the first movement mechanism is further configured to move the gradient refractive index lens array intermittently across the area of the exposed substrate in the first direction.

9. The apparatus according to claim 1, further comprising a second movement mechanism configured to move the gradient refractive index lens array in a third direction that is perpendicular to the exposed substrate to focus the projected pattern onto the exposed substrate.

10. A method comprising:
positioning a mask on which a pattern is formed;
positioning an illuminating device proximate to a first side of the mask;
positioning an exposed substrate proximate to a second side of the mask;
positioning a gradient refractive index lens array between the mask and the exposed substrate;
moving the gradient refractive index array across an area of the exposed substrate in a first direction on a two dimensional plane that is parallel to the exposed substrate; and
moving the gradient refractive index lens array across the area of the exposed substrate in a second direction on the two dimensional plane to provide uniform exposure of the exposed substrate to the projected pattern, wherein the second direction is perpendicular to the first direction.

11. The method according to claim 10, wherein the mask on which the pattern is formed is a transmission type shutter array comprising of a plurality of shutters, and further comprising opening or closing each of the plurality of shutters to form the pattern on the mask.

12. The method according to claim 10, wherein the mask on which the pattern is formed is a reflection type shutter array comprising a plurality of shutters, and further comprising opening or closing each of the plurality of shutters to create the pattern on the mask.

13. The method according to claim 10, wherein the mask and the illuminating device form a light emitter array comprising a plurality of light emitters, and further comprising turning each of the plurality of light emitters on or off to create the pattern on the mask.

14. The method according to claim 13, further comprising turning on or turning off each of the plurality of the light emitters to form the pattern on the mask while the exposed substrate is exposed to the projected pattern.

15. The method according to claim 10, further comprising moving the gradient refractive index lens array intermittently across the area of the exposed substrate in the first direction.

16. The method according to claim 10, further comprising moving the gradient refractive index lens array in a third direction that is perpendicular to the exposed substrate to focus the projected pattern onto the exposed substrate.

17. A non-transitory computer-readable medium having instructions stored thereon, the instructions comprising:
instructions to position a mask on which a first pattern is formed;
instructions to position an illuminating device proximate to a first side of the mask;
instructions to position an exposed substrate proximate to a second side of the mask; and
instructions to position a gradient refractive index lens array between the mask and the exposed substrate;
instructions to move the gradient refractive index array across an area of the exposed substrate in a first direction on a two dimensional plane that is parallel to the exposed substrate;
instructions to move the gradient refractive index lens array in a second direction to focus the projected pattern onto the exposed substrate, wherein the second direction is perpendicular to the first direction.

18. The non-transitory computer-readable storage medium of claim 17, wherein the instructions further comprise instructions to move the gradient refractive index lens array intermittently across the area of the exposed substrate in the first direction.

19. The non-transitory computer-readable storage medium of claim 17, wherein the instructions further comprise instructions to move the gradient refractive index lens array intermittently across the area of the exposed substrate in the second direction.

20. The non-transitory computer-readable storage medium of claim 17, wherein the mask comprises a light emitter array, and wherein the instructions further comprise instructions to turn on or turn off light emitters of the light emitter array to form the pattern on the mask while the exposed substrate is exposed to the projected pattern.

* * * * *

UNITED STATES PATENT AND TRADEMARK OFFICE
CERTIFICATE OF CORRECTION

PATENT NO. : 8,421,999 B2
APPLICATION NO. : 12/523917
DATED : April 16, 2013
INVENTOR(S) : Horiuchi et al.

It is certified that error appears in the above-identified patent and that said Letters Patent is hereby corrected as shown below:

In the Specification

In Column 2, Line 45, delete "an light" and insert -- a light --, therefor.

In Column 15, Line 48, delete "unit is provided." and insert -- unit 44 is provided. --, therefor.

In Column 16, Line 27, delete "alight" and insert -- a light --, therefor.

In Column 20, Line 26, delete "did not performed, away that the" and insert -- did not perform, a way that the --, therefor.

Signed and Sealed this
Twenty-ninth Day of October, 2013

Teresa Stanek Rea
*Deputy Director of the United States Patent and Trademark Office*

UNITED STATES PATENT AND TRADEMARK OFFICE
CERTIFICATE OF CORRECTION

| | | Page 1 of 1 |
|---|---|---|
| PATENT NO. | : 8,421,999 B2 | |
| APPLICATION NO. | : 12/523917 | |
| DATED | : April 16, 2013 | |
| INVENTOR(S) | : Horiuchi et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 937 days.

Signed and Sealed this
Twenty-fourth Day of December, 2013

Margaret A. Focarino
*Commissioner for Patents of the United States Patent and Trademark Office*